(12) United States Patent
Raykov

(10) Patent No.: US 10,424,096 B1
(45) Date of Patent: Sep. 24, 2019

(54) TECHNIQUE FOR ORTHOGONAL EDGE ROUTING OF DIRECTED LAYERED GRAPHS WITH EDGE CROSSINGS REDUCTION

(71) Applicant: Jordan Raykov, Boulder, CO (US)

(72) Inventor: Jordan Raykov, Boulder, CO (US)

( * ) Notice: Subject to any disclaimer, the term of this patent is extended or adjusted under 35 U.S.C. 154(b) by 0 days.

(21) Appl. No.: 16/271,286

(22) Filed: Feb. 8, 2019

(51) Int. Cl.
  *G06T 11/20* (2006.01)
  *G06F 17/50* (2006.01)
  *G06F 3/0481* (2013.01)

(52) U.S. Cl.
  CPC .......... *G06T 11/206* (2013.01); *G06F 3/0481* (2013.01); *G06F 17/509* (2013.01)

(58) Field of Classification Search
  None
  See application file for complete search history.

(56) References Cited

U.S. PATENT DOCUMENTS

| | | | |
|---|---|---|---|
| 4,953,106 A | 8/1990 | Gasner | |
| 5,943,062 A | 8/1999 | Schanel | |
| 7,530,040 B1* | 5/2009 | Balsdon | G06F 17/5077 716/129 |
| 7,932,907 B2 | 4/2011 | Nachmanson | |
| 8,237,716 B2 | 8/2012 | Kolipaka | |
| 8,482,565 B2 | 7/2013 | Nachmanson | |
| 8,599,204 B2 | 12/2013 | Stuart | |
| 8,933,937 B2 | 1/2015 | Nachmanson | |
| 8,994,730 B2 | 3/2015 | Breeds | |
| 2004/0098697 A1* | 5/2004 | Frankle | G06F 17/5077 716/129 |
| 2006/0288322 A1* | 12/2006 | Zhang | G06F 17/5077 716/119 |
| 2012/0280999 A1* | 11/2012 | Nachmanson | G06T 11/206 345/440 |

OTHER PUBLICATIONS

Emden R. Ganser et al., "A Technique for Drawing Directed Graphs" AT&T Bell Laboratories Murray Hill, New Jersey 07974 https://www.graphviz.org/Documentation/TSE93.pdf.

(Continued)

*Primary Examiner* — Nurun N Flora

(57) ABSTRACT

A computer-implemented technique for orthogonal edge routing of directed layered graphs with edge crossings reduction is presented. The pre-arranged nodes are positioned on a rectangular grid consisting of layers across the flow direction and lanes along the flow direction. The layers are separated by rectangular regions defined as layer pipes, and the lanes are separated by rectangular regions defined as lane pipes. Each pipe contains one or more ordered segment tracks. The edges are routed along the shortest paths as orthogonal polylines composed of chained line segments. Each segment is assigned to a pipe. The segments within a pipe are positioned on segment tracks. The edge crossings reduction phase contains iterative procedures to resolve intersections between segments. To resolve the crossings between edges the pairs of conflicting segments are swapped or segments are repositioned on adjacent segment tracks, effectively rubber banding the segments while considering the shortest paths of edges.

12 Claims, 23 Drawing Sheets

(56) References Cited

OTHER PUBLICATIONS

Michael Wybrov et al., "Orthogonal connector routing" International Symposium on Graph Drawing (GD), pp. 219-231. Springer, 2009. http://citeseerx.ist.psu.edu/viewdock/download;jsessionid=579B148C3160452F0EE0A3F0115E7A36?doi=10.1.1.159.2326&rep=rep1&type=pdf.

David P. Dobkin et al., "Implementing a General-Purpose Edge Router" Princeton University, Princeton NJ 08544, USA AT&T Laboratories, Florham Park NJ 07974, USA http://dpd.cs.princeton.edu/Papers/DGKN97.pdf.

Christoph D. Schulze et al., "Drawing Layered Graphs with Port Constraints" Journal of Visual Languages & Computing 25(2)—Apr. 2014 https://www.researchgate.net/publication/258433383_Drawing_Layered_Graphs_with_Port_Constraints.

Miroslav Cermak et al., "Edge routing and bundling for graphs with fixed node positions" Department of Software Engineering, Charles University, Prague, Czech Republic https://www.computer.org/csdl/proceedings/iv/2011/0868/00/06004087.pdf.

Christian A. Duncan et al., "Planar Orthogonal and Polyline Drawing Algorithms" University of California, Irvine Published 2013 in Handbook of Graph Drawing and Visualization http://cs.brown.edu/people/rtamassi/gdhandbook/chapters/orthogonal.pdf.

Michael A>Bekos et al., "Line Crossing Minimization on Metro Maps" International Symposium on Graph Drawing, 2007: Graph Drawing pp. 231-242 http://link.springer.com/chapter/10.1007/978-3-540-77537-9_24 https://link.springer.com/content/pdf/10.1007%2F978-3-540-77537-9_24.pdf.

Giuseppe Di Batista et al., "Graph drawing: algorithms for the visualization of graphs" Prentice Hall, 1999 ISBN: 0-13-301615-3.

Michael Forster, Applying Crossing Reduction Strategies to Layered Compound Graphs' University of Passau, 94030 Passau, Germany https://pdfs.semanticscholar.org/5d6f/de3d38417a5a92380ab09f3d84cffb8d0054.pdf.

\* cited by examiner

200A

200B

TECHNIQUE FOR ORTHOGONAL EDGE ROUTING OF DIRECTED LAYERED GRAPHS WITH EDGE CROSSINGS REDUCTION

TECHNICAL FIELD

Drawing of directed graphs

DESCRIPTION

Background

Graph drawings are commonly used to model or document data flows, complex data structures or processes, system behavior and management, knowledge representation, and many others. Most often the orthogonal edge drawing is being used as the common graph presentation mode. The main objective of the software tools for automated generation of graph drawings is to produce diagrams that are easy to read and to navigate. The task of the automated edge routing is to delineate uncluttered edge paths around the nodes, as well as to achieve a minimal number of crossings between the edges.

Some known solutions use sophisticated path-finding algorithms. Other solutions, based on the layered node layout, introduce abstract virtual nodes on each intermediate layer in search of optimal visibility routes. Some other solutions limit the task to the consideration of acyclic graphs only. Most existing solutions are narrowly oriented toward specific classes of diagrams. Those that are more wide ranging work for small or simple diagramming flows but they are not suitable in all cases, especially for large and complex graphs and particularly when it comes to implementations in interactive diagramming tools.

The reduction of edge crossings is a complex mathematical problem in the computational complexity theory, considered to be an NP-complete decision problem. NP-complete problems most often are addressed by using heuristic methods. As the graph size grows, the reduction of edge crossings becomes increasingly difficult. When the graph nodes do not have strict positioning constraints, rearranging some nodes may eliminate many of the crossings between edges connected to these nodes, which simplifies the problem. However, in most cases the clarity of the drawing has the highest priority, which restricts the positions of the nodes within certain areas of the diagram. Currently existing solutions use certain heuristic techniques that provide partial crossings minimization. With more complex graphs these techniques usually yield unsatisfactory results, producing unpredictable clutter or visualizations that are aesthetically unappealing and difficult to read.

BRIEF SUMMARY

The following is a summary of the presented method intended to provide a basic understanding of this method. Embodiments of the presented method provide computer-implemented techniques for the orthogonal edge routing of complex layered directed graphs with predetermined positions of the nodes, as well as for the reduction of the number of edge crossings to their minimal levels. The described techniques do not depend on the size and complexity of the graphs, including cyclic graphs. At the same time these techniques provide clear, uncluttered and easy to comprehend diagrams for a wide variety of implementations, eliminating most drawbacks of the existing solutions noted in the Background section. These advantages and other benefits are underscored below in the Detailed Description.

In an embodiment, this method includes receiving a set of nodes with predetermined positions and a set of edge connections. The nodes can have different flowchart shapes. The flow direction of the graph can be either top to bottom, or left to right. The positions of the nodes are mapped to a rectangular grid consisting of layers across the flow direction and lanes along the flow direction. The nodes are positioned in the cells at the intersections of the layers and the lanes. The layers are separated by rectangular regions defined as layer pipes, and the lanes are separated by rectangular regions defined as lane pipes. Each pipe contains zero or more segment tracks running lengthwise within the pipe and positioned at a predetermined distance from each other. The edges are represented as polylines that are routed along the pipes. Each edge corresponds to an edge connection between two nodes and consists of a polygonal chain of line segments.

In an embodiment, in the first phase, the shortest paths to route the edges are determined by applying Dijkstra's algorithm. For each edge, the segments created as parts of a polygonal chain are assigned to layer pipes or to lane pipes along the shortest path. The segments within each pipe are positioned on segment tracks defining the segment locations within the pipe. The segment tracks are created and added to pipes as needed whenever a segment is assigned to a pipe. Each segment track can contain one or more non-overlapping segments. In certain cases the edges shortest paths are allowed to cross through empty cells. These procedures exclude the possibility for the edges to cross graph nodes and guarantee the spacing between adjacent segments and between segments and nodes. Moreover, the routing techniques in the presented method provide possibilities for an efficient reduction of edge crossings.

In an embodiment, the subsequent phase contains procedures to eliminate or to reduce to a minimum the number of crossings between edges. These procedures include iterations for: (a) resolving the intersections between segments around the source ends of the edges, (b) resolving the intersections between segments around the target ends of the edges, and (c) resolving the intersections between segments in pipes and their adjacent segments. To eliminate these intersections, the conflicting segments are repositioned on adjacent segment tracks or on new parallel segment tracks. Since the segments are chained, the repositioning of segments does not break the chains of segments; rather, the segments are effectively rubber banded while considering the shortest paths of the edges.

This summary introduces briefly the basic concepts in the embodiments of the presented method. The full disclosure of these concepts and all supporting features are presented in the Detailed Description.

BRIEF DESCRIPTION OF THE DRAWINGS

The drawings listed below are referred to and further explained in the Detailed Description. The use of the same reference numbers in different figures indicates similar or identical items.

DETAILED DESCRIPTION

In the following description, embodiments of the presented method will be fully described with references to the accompanying drawings. It is assumed that other embodiments may be used within the scope of this disclosure. For purposes of explanation, specific details are set forth in order to provide a thorough understanding of the embodiments. This disclosure will be detailed and complete, and will be sufficient to convey the presented method to persons with knowledge in this particular technical field. Some well-known features may be omitted or simplified in order not to obscure the description.

The presented method provide computer-implemented techniques for the automatic orthogonal edge routing of complex layered directed graphs as well as techniques for the reduction of crossings between edges. In some embodiments, this method includes receiving a set of nodes with predetermined positions and a set of edge connections. The routed edges are represented as polygonal chains of line segments. The reduction of edge crossings includes iterative analysis of the edges to detect intersections between segments and instant steps to resolve them. This approach ensures the advantages of the presented method over the existing techniques. The heuristic techniques implemented in the presented method eliminate the edge crossings or reduce them to their minimal levels. The advantages of these techniques will become apparent from the following description and the accompanying drawings.

In the embodiments of this method, the flow direction of the graph can be either top to bottom, or left to right. Embodiments described herein use identical computational steps to produce the corresponding graph diagram for each of these flow directions. In order to navigate the diagram independently from the particular flow direction, the terms 'along the flow direction' and 'across the flow direction' are being used. In the examples described below the selected flow direction is top to bottom.

Figure 1:
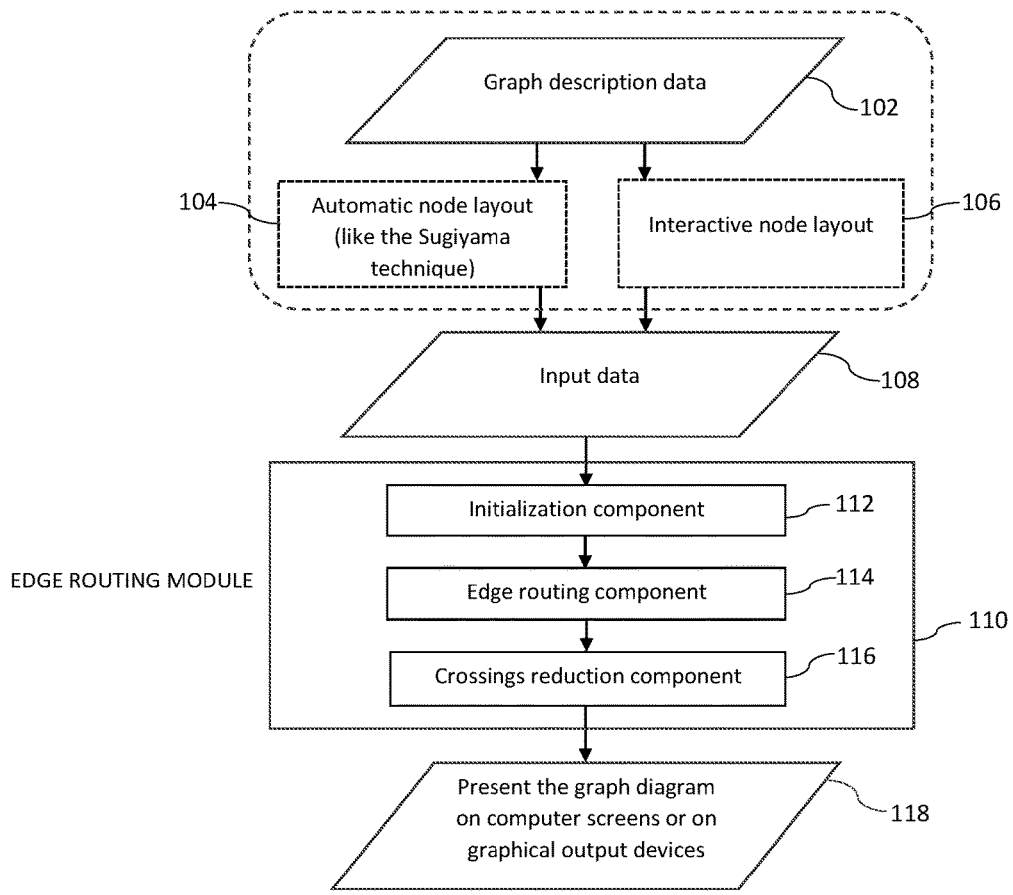
FIG. 1 illustrates an example system for the edge routing of a layered graph, in accordance with at least one embodiment.

FIG. 1 100 illustrates an example system for the edge routing of a layered graph, in accordance with at least one embodiment. As shown in 100, embodiments of the edge routing method operate by receiving graph input data 108 containing a set of pre-arranged nodes and a set of edge connections between nodes.

The edge routing procedures are preceded by node layout procedures that are outside the scope of the presented method. In some cases graph input data 108 may be obtained from automatic node layout procedures 104, like the Sugiyama technique, that produce a structure of a layered graph based on graph description data 102. In other cases the node layout may be obtained from an interactive node layout procedure 106 following some structural or purely visual considerations, still based on graph description data 102. It is assumed that nodes are positioned on a grid consisting of layers across the flow direction and lanes along the flow direction.

As illustrated in graphical representation 100, the implementations of the routing procedures are represented in edge routing module 110. In some embodiments, edge routing module 110 can be implemented using hardware components or software program components running on different computing devices. In an embodiment, edge routing module 110 includes an initialization component 112, an edge routing component 114 and a crossings reduction component 116. Finally a routed graph diagram is presented on computer screens or on graphical output devices 118.

Initialization component 112 receives graph input data 108 containing a set of nodes with predetermined positions and a set of edge connections. Based on the content of the set of nodes with the predetermined positions, it further initializes a canvas grid structure of layers and lanes discussed later in greater detail. Edge routing component 114 traverses the set of edge connections in the order they are presented. It then determines, for each edge connection, the shortest path for routing the edge, creates the polygonal chain of segments and routes them along the calculated shortest path. Each edge connection is supposed to connect two nodes and is represented in the diagram by a separate edge. Edge routing component 114 eventually creates a set of edges. Crossings reduction component 116 iterates through the set of edges and includes procedures to minimize the number of crossings between edges. During the edge routing procedures the positions of the nodes are not altered.

A. Definitions

Figure 2:
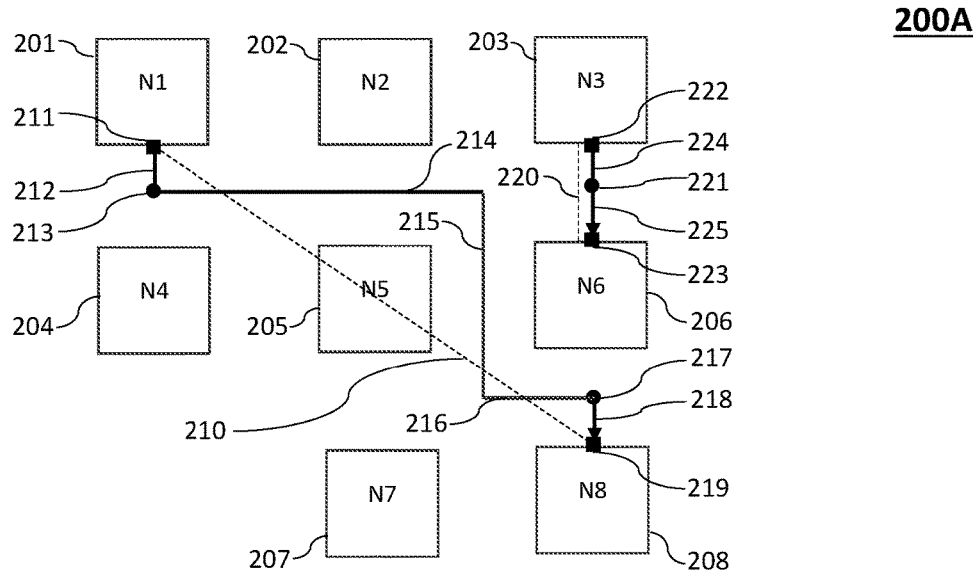
FIG. 2 illustrates examples of graphical representations of parts of graph diagrams, in accordance with at least one embodiment.
Figure 2:
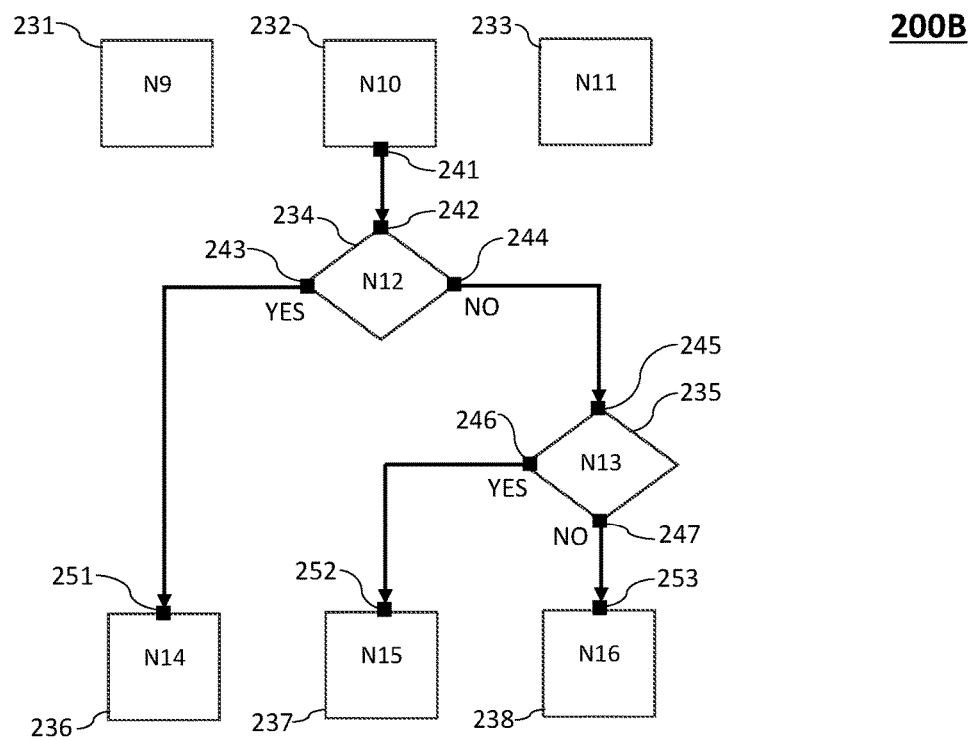

In order to define the terminology used in this document, FIG. 2 illustrates examples of graphical representations 200A-B of parts of graph diagrams, in accordance with at least one embodiment. As set forth by ANSI, process nodes 201 (N1), 202 (N2), 203 (N3), 204 (N4), 205 (N5), 206 (N6), 207 (N7), 208 (N8), 231 (N9), 232 (N10), 233 (N11), 236 (N14), 237 (N15), and 238 (N16) use rectangular shapes as shown in 200A-B, and decision nodes 234 (N12) and 325 (N13) use diamond shapes as shown in 200B. In various embodiments of this method, other flowchart symbols may be used as well, in conformity with the concepts of the routing procedures described herein.

Each edge connection connects two nodes. Each edge consists of a polygonal chain of line segments. The segments are chained in such a way that consecutive segments share their start and end point objects: the start point of the next segment in the chain is the end point of the previous segment and so on. The points of attachment of the ends of an edge to the connected nodes are called ports. The node at the originating end of an edge connection is defined as a source node, and the node at the terminating end is defined as a target node. Each segment chain of a routed edge starts at an output port on the source node and ends at an input port on the target node. As graphical representation 200A illustrates, edge connection 210 between nodes 201 (N1) and 208 (N8) corresponds to an edge consisting of segments 212, 214, 215, 216, and 218. Node 201 (N1) is the source node and node 208 (N8) is the target node of edge connection 210. The first segment 212 starts at output port 211 of source node 201 (N1) and the last segment 218 ends at input port 219 of target node 208 (N8). A terminating end of an edge connection is graphically indicated by an arrowhead at the last segment of the corresponding edge as it is shown on the last segment 218.

The side of a node that is facing forwards along the flow direction is defined as a front side, and the side that is facing backwards is defined as a back side. In the embodiments illustrated in this description, the following non-limiting conventions have been set forth: (a) input ports of a process node are located on the back side, (b) output ports of a process node are located on the front side, (c) a single input port of a decision node is located on the back side, (d) two output ports of a decision node are located on either front, left or right sides, where left or right is determined with respect to the selected flow direction. These conventions have been adopted only in order to simplify the explanation of the routing procedures described in this document. In the embodiments of the presented method, input ports as well as output ports can be located on either front, back, left or right sides of nodes without restrictions. Input and output ports are created and added to respective nodes (node sides) during the routing procedures. Multiple ports on the same side of a node are ordered.

As illustrated in graphical representation 200B, input port 251 of process node 236 (N14), input port 252 of process node 237 (N15), input port 253 of process node 238 (N16), input port 242 of decision node 234 (N12), and input port 245 of decision node 235 (N13) are located on the back sides of the respective nodes. Output port 241 of process node 232 (N10) is located on the front side of said process node. Output port 243 and output port 244 of decision node 234 (N12) are located on the left side and on the right side respectively. Output port 246 and output port 247 of decision node 235 (N13) are located on the right side and on the front side respectively.

The first segment of an edge is defined as a source segment handle, and the last segment of an edge is defined as a target segment handle. The source segment handle starts at an output port on a source node and extends orthogonally to a point defined as a source anchor point. As shown in 200A, segment 212 is a source segment handle, it starts at output port 211 and extends to source anchor point 213. The target segment handle starts at a point defined as a target anchor point and extends orthogonally to an input port of a target node. As shown in 200A, segment 218 is a target segment handle, it starts at a target anchor point 217 and extends to input port 219. Both anchor point 213 and anchor point 217 determine the remaining part of the segment chain of the edge. As explained in more detail later, edge routing component 114 proceeds for each edge connection in the following steps: (a) calculate the locations of the two anchor points that will determine the two segment handles, (b) find the shortest orthogonal path between the anchor points and create the remaining chain of segments along the shortest path. There are some cases where a source anchor point coincides with a target anchor point, as shown in 200A. Edge connection 220 between adjacent nodes 203 (N3) and 206 (N6) corresponds to an edge consisting of segments 224 and 225. The first segment is source segment handle 224 that starts at output port 222 and extends to shared anchor point 221. The second segment is target segment handle 225 that starts at shared anchor point 221 and extends to input point 223. There are other specific cases where the locations of the anchor points are calculated based on some particular conditions that will be discussed in more detail later.

In the embodiments of this method, each segment is oriented along the axes of the coordinate plane, i.e. along or across the flow direction. Edge routing component 114 produces a set of the edges $E(e_1, \ldots, e_n)$ where each edge contains the set of its chained segments $e_i(s_1, s_k)$. Each segment is represented as a vector $s_j(p_{j1}, p_{j2})$ defined by its start point $p_{j1}(x_{j1}, y_{j2})$ and its end point $p_{j2}(x_{j2}, y_{j2})$. The calculations to determine the positions in the plane of two segments relative to each other are based on their start and end points.

Figure 3:
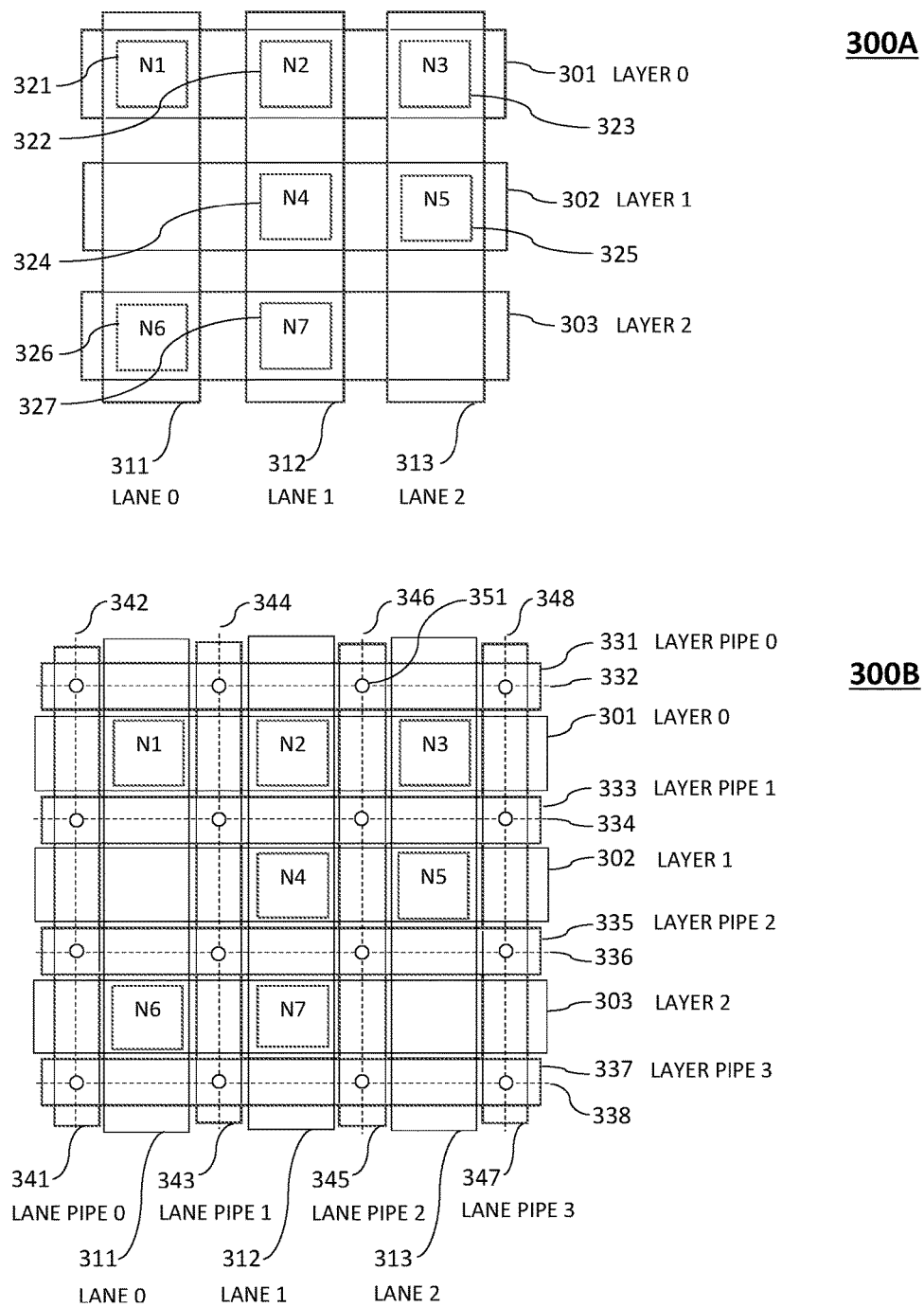
FIG. 3 illustrates an example of the structure of the graph diagram canvas, in accordance with at least one embodiment.

FIG. 3 300A-B illustrates an example of the structure of the graph diagram canvas, in accordance with at least one embodiment. The predetermined positions of the nodes provided at the input are mapped to a grid as shown in 300A consisting of consecutive layers oriented across the flow direction and consecutive lanes oriented along the flow direction. In this illustration and in the illustrations that follow, the flow direction is assumed to be top to bottom, as it was already mentioned. In the example shown in 300A-B layer 301 (LAYER 0), layer 302 (LAYER 1) and layer 303 (LAYER 2) appear across the flow direction, and lane 311 (LANE 0), lane 312 (LANE 1) and lane 313 (LANE 2) appear along the flow direction. The intersections between layers and lanes represent the cells of the grid. The nodes are located in the corresponding cells, according to their predetermined positions. The particular position of each node is determined by its layer number and its lane number which have been previously assigned. It is assumed that nodes 321 (N1), 322 (N2), 323 (N3), 324 (N4), 325 (N5), 326 (N6) and 327 (N7) are placed correspondingly. Each edge has a source node and a target node, as discussed in relation to FIG. 2. As long as the edge structure is discussed, the layer of a source node is defined as a source layer and the lane of a source node is defined as a source lane. Similarly, the layer of a target node is defined as a target layer and the lane of a target node is defined as a target lane.

The rectangular regions around the layers are defined as layer pipes, and the rectangular regions around the lanes are defined as lane pipes. Most of the segments of the edges are laid out along the layer pipes and the lane pipes. In this document both the layer pipes and the lane pipes are referred to as pipes. The pipes are forming a pipe grid shown in 300B, consisting in this case of layer pipe 331 (LAYER PIPE 0), layer pipe 333 (LAYER PIPE 1), layer pipe 335 (LAYER PIPE 2) and layer pipe 337 (LAYER PIPE 3) around layer 301 (LAYER 0), layer 302 (LAYER 1) and layer 303 (LAYER 2), and of lane pipe 341 (LANE PIPE 0), lane pipe 343 (LANE PIPE 1), lane pipe 345 (LANE PIPE 2) and lane pipe 347 (LANE PIPE 3) around lane 311 (LANE 0), lane 312 (LANE 1) and lane 313 (LANE 2). The median line of each rectangular shape representing a pipe that is running lengthwise is referred to as a main median line. In graphical representation 300B the main median lines are shown with dashed lines, these are main median lines of layer pipes 332, 334, 336, and 338, and main median lines of lane pipes 342, 344, 346 and 348. The crossings between the main median lines of layer pipes and the main median lines of lane pipes are marked in 300B with circles, where one example is crossing 351 between main median line 332 of layer pipe 331 (LAYER PIPE 0) and main median line 346 of lane pipe 345 (LANE PIPE 2). The locations of the main median lines and their crossings are used to calculate the shortest paths of the edges during the stages of the routing procedures. Layers, lanes, layer pipes and lane pipes represent structural elements of the drawing canvas of the diagram and are visualized and drawn here as rectangular shapes for illustration purposes only. The edges are routed by assigning their segments to the corresponding pipes, as will be disclosed in more detail below. The nodes and the edges, together with the structural elements, are referred to in this document as graphical elements of the diagram, or simply as elements.

To clarify the terminology used in this document, there is a difference between the position of a graphical element and its location. The 'position' of a layer, lane or pipe is determined by their order number in the drawing canvas as shown in 300A-B, while the 'position' of a node is determined by its layer number and its lane number, as already mentioned. The 'location' of a graphical element refers to its XY location—its coordinates in the coordinate system of the drawing canvas for the diagram. The positions of the graphical elements are used when calculating their locations. As it becomes apparent, the locations of all graphical elements that are part of the diagram need to be properly updated at all steps of the edge routing process, as well as the crossing reduction process.

Each pipe contains a plurality of parallel segment tracks along its length. Multiple segment tracks within a pipe are positioned at a predetermined distance from each other. The segment tracks do not have physical width. When a new segment is assigned to a pipe, it is positioned on a segment track. Each segment track can contain one or more non-overlapping segments from different edges. Overlapping conflict between two collinear segments is considered to occur whenever the distance between the segments is less than a predetermined value. New segment tracks are created and added to pipes during the routing procedures as needed whenever a new segment is assigned to a pipe. The segment tracks within each pipe are arranged in order. The segment track index is used to calculate the locations of the segments positioned on it.

As disclosed before, the segments of an edge are chained. Chaining allows for a segment to be repositioned to a different segment track in the same pipe or further away to a segment track in another pipe that is parallel to the first one while preserving the chain of segments. Since the translation of a segment changes its start and end points, its adjacent segments from the chain change their length correspondingly and the segments are effectively rubber banded. Translation of segments is used to rearrange the positions of the segments of conflicting edges in order to reduce crossings between the edges, as disclosed further below.

B. Initialization

In the embodiments of this method, the current locations of the graphical elements are used to make the necessary calculations at different stages of the routing procedures. The preliminary computational steps are to calculate the initial locations of the structural elements of the canvas described above—the layers, the lanes, the layer pipes and the lane pipes, as well as the pre-arranged nodes. At this stage the pipes still do not have segments assigned to them and their cross sizes are equal to the predetermined minimal distance between segments. During the stages of the routing procedures segments are added to or removed from the pipes and this affects the cross sizes of these pipes. The cross sizes of the layers and the lanes are determined by the sizes of the allocated nodes. The sizes of the nodes at the beginning of the routing stage are predetermined based on structural considerations. The width of the line segments is predetermined as well. During the routing of each edge connection a new output port is created at a source node and a new input port is created at a target node. The new ports are located on the respective sides of the nodes next to already existing ports, if any, at a predetermined distance called 'port step'. This leads to an increase in sizes of the graphical shapes of these nodes. In order to keep the current locations of the elements up to date, the locations of all graphical elements, including the start and end points of the segments, are dynamically recalculated at each procedural step whenever their sizes are affected.

C. Routing the Edges

As noted earlier, edge routing component 114 traverses the set of edge connections in the order they are provided. Each edge connection is routed following a sequence of procedural steps. Embodiments of the presented method begin with creating a new output port at the source node and a new input port at the target node. The next step is to create a source anchor point and a target anchor point and to create a source segment handle as the first segment of the edge and a target segment handle as the last segment of the edge. For each of the two nodes the initial locations of the anchor points are determined in two steps identical for both the source anchor point and the target anchor point: (a) find the orthogonal projection of the respective port onto the main median line of the adjacent pipe, and (b) analyze the neighboring cells in the layer and the lane where the node is positioned. In most cases the initial anchor point is located on the main median line of the corresponding adjacent pipe. However if some empty neighboring cells are detected, the anchor point is pushed further away, as illustrated later. The initial locations of the anchor points are necessary to calculate the shortest path for each edge. After the edge is routed, the locations of the anchor points are adjusted on the respective segment tracks when the segments are assigned to the corresponding pipes, as described later. FIGS. 4-11 are examples that demonstrate different cases of creating segment handles and routing the respective edges.

Once source segment handles and target segment handles are determined by the locations of the anchor points, the next step is to determine the shortest orthogonal path between the two anchor points. This is achieved by applying Dijkstra's algorithm. The set of weighted graph vertices, supplied to the algorithm, includes the source anchor point as a source vertex, the target anchor point as a destination vertex, and the crossings of all main median lines as shown in graphical representation 300B. The running of Dijkstra's algorithm produces a resulting set of vertices defining the shortest orthogonal path between the source vertex and the destination vertex. Each collinear group of vertices from the resulting set defines a new segment along a main median line of a pipe. Each new segment is assigned to said pipe and positioned on the respective segment track, as disclosed later in detail.

There are cases when there is a direct visibility between two anchor points. In such simple cases Dijkstra's algorithm is not applied, as disclosed later.

Figure 4:
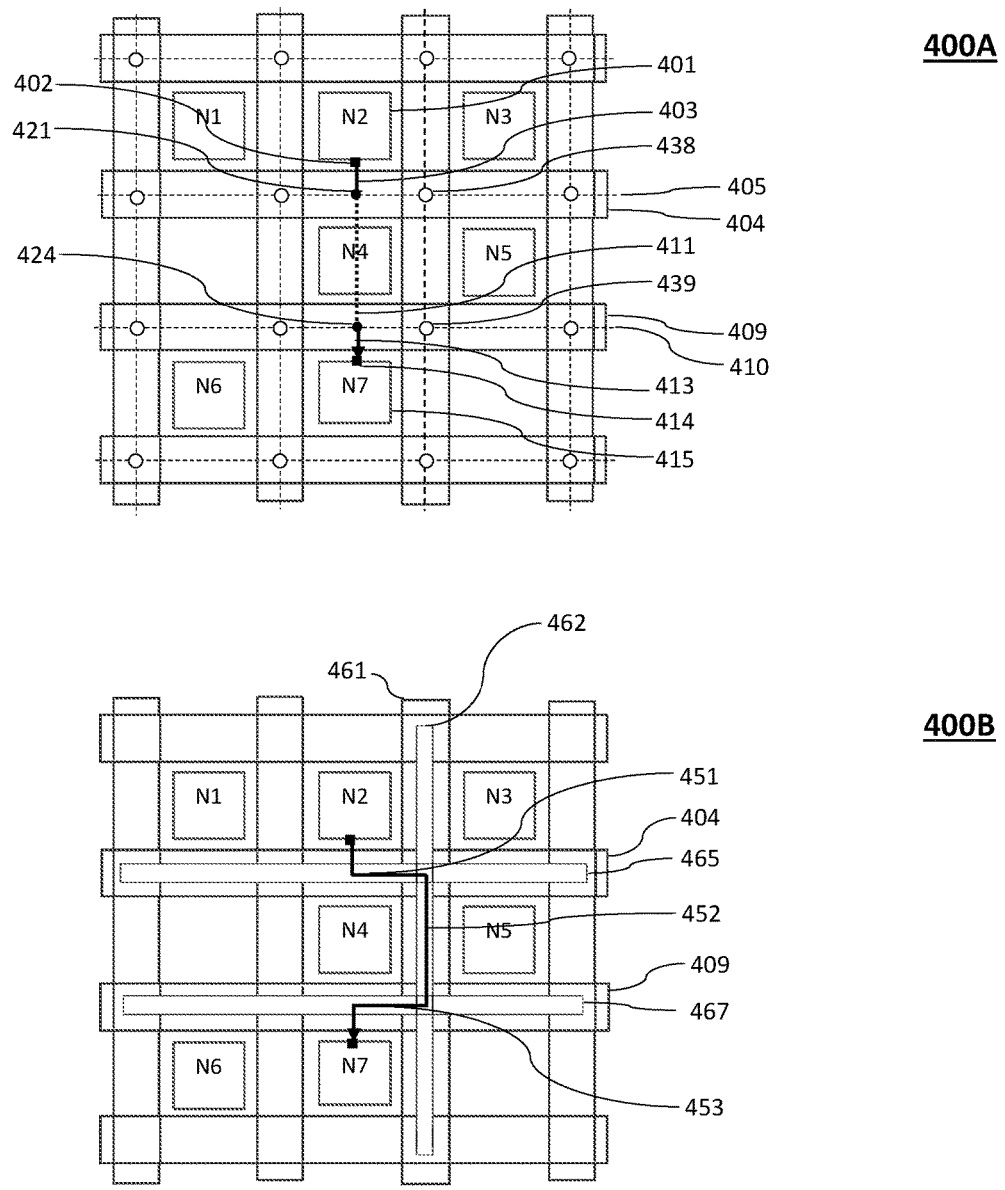
FIG. 4 illustrates an example of routing involving process nodes, in accordance with at least one embodiment.

FIG. 4 400A-B illustrate an example of routing involving process nodes, in accordance with at least one embodiment. As shown in graphical representation 400A, a source segment handle 403 and a target segment handle 413 have been created for edge connection 411 between node 401 (N2) and node 415 (N7). Source segment handle 403 begins at output port 402 of node 401 (N2) and extends to source anchor point 421 on main median line 405 of layer pipe 404, and target segment handle 413 begins at target anchor point 424 on main median line 410 of layer pipe 409 and extends to input port 414 of node 411 (N7). Pipe crossings 438 and 439 are selected as vertices for computing the shortest path for edge connection 411. Graphical representation 400B shows the final results of the computational steps when applying Dijkstra's algorithm to obtain the shortest path between source anchor point 421 and target anchor point 424. The edge that has been created includes new segment 451, new segment 452 and new segment 453. Segment 451 becomes assigned to layer pipe 404. A new segment track 465 is created in layer pipe 404 and segment 451 is positioned on segment track 465. Segment 452 becomes assigned to lane pipe 461. A new segment track 462 is created in lane pipe 461 and segment 452 is positioned on segment track 462. Segment 453 becomes assigned to layer pipe 409. A new segment track 467 is created in layer pipe 409 and segment 453 is positioned on segment track 467.

Figure 5:
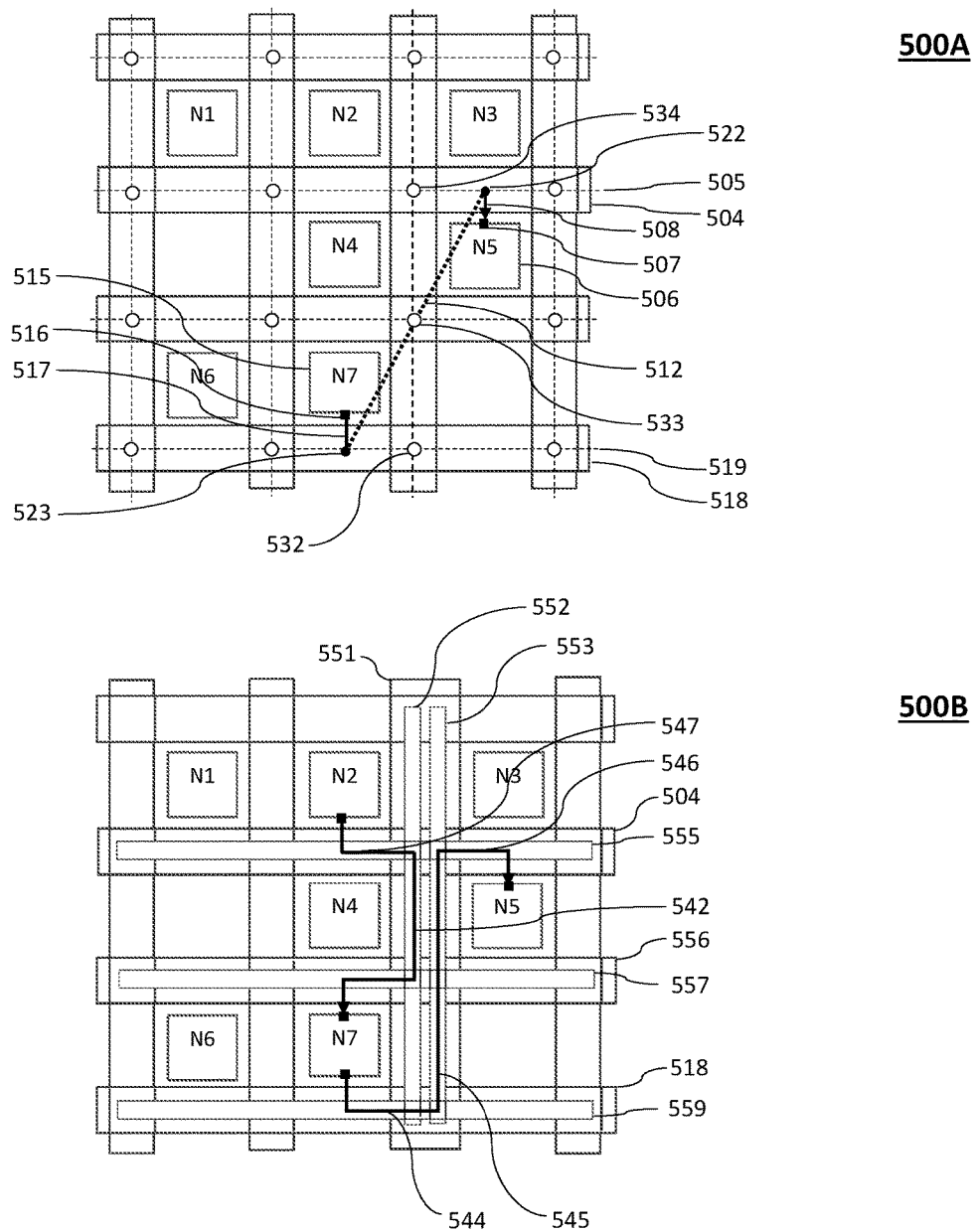
FIG. 5 illustrates another example of routing involving process nodes, in accordance with at least one embodiment.

FIG. 5 500A-B illustrate another example of routing involving process nodes, in accordance with at least one embodiment. As shown in graphical representation 500A, a source segment handle 517 and a target segment handle 508 have been created for edge connection 512 between node 515 (N7) and node 506 (N5). Source segment handle 517 begins at output port 516 of node 515 (N7) and extends to source anchor point 523 on main median line 519 of layer pipe 518, and target segment handle 508 begins at target anchor point 522 on main median line 505 of layer pipe 504 and extends to input port 507 of node 506 (N5). In graphical representation 500A, pipe crossings 532, 533 and 534 are selected as vertices for computing the shortest path for edge connection 512. Graphical representation 500B shows the final results of the computational steps for edge connection 512 when applying Dijkstra's algorithm to obtain the shortest path between source anchor point 523 and target anchor point 522. The edge that has been created includes new segment 544, new segment 545 and new segment 546. Segment 544 becomes assigned to layer pipe 518. A new segment track 559 is created in layer pipe 518 and segment 544 is positioned on segment track 559. Segment 545 becomes assigned to lane pipe 551. This pipe already has a segment track 552 with a segment 542 positioned on it from the routing of a previous edge, and in case segment 545 is positioned on segment track 552, segment 545 will overlap with the existing segment 542. For this reason a new segment track 553 is created and added to lane pipe 551 and segment 545 is positioned on segment track 553. Segment 546 becomes assigned to layer pipe 504. This pipe already has a segment track 555 with segment 547 positioned on it from the routing of a previous edge. Since segment 546 does not overlap with segment 547, the segment 546 is positioned on the existing segment track 555.

Figure 6:
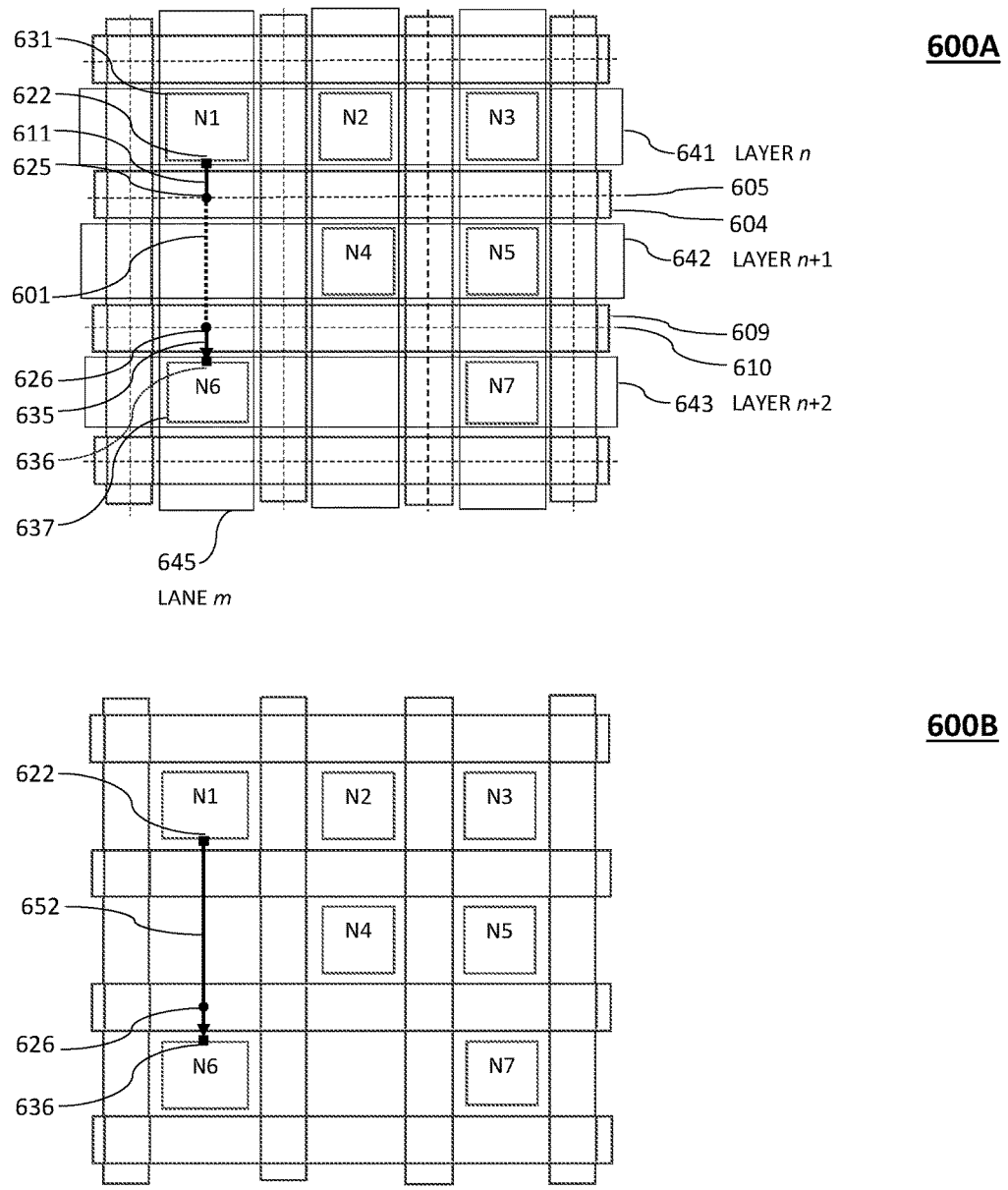
FIG. 6 illustrates another example of routing involving process nodes, in accordance with at least one embodiment

FIG. 6 600A-B illustrate another example of routing involving process nodes, in accordance with at least one embodiment. As shown in graphical representation 600A, initially a source segment handle 611 and a target segment handle 635 have been created for edge connection 601 between node 631 (N1) and node 637 (N6). Source segment handle 611 begins at output port 622 of node 631 (N1) and extends to source anchor point 625 on main median line 605 of layer pipe 604, and target segment handle 635 begins at target anchor point 626 on main median line 610 of layer pipe 609 and extends to input port 636 of node 637 (N6). Further analysis shows that (a) the number of layers between source layer 641 (LAYER n) and target layer 643 (LAYER n+2) is greater than zero, and (b) the cell at layer 642 (LAYER n+1) and source lane 645 (LANE m) is empty. This allows for source anchor point 625 to be moved to the location of target anchor point 626 which becomes a shared anchor point 626. As a result a new source segment handle 652 now begins at output port 622 of node N1 631 and extends to the shared anchor point 626 on main median line 610 of layer pipe 609. Since the source anchor point and the target anchor point coincide with each other in the shared anchor point 626, the routing of this edge is finished.

Figure 7:
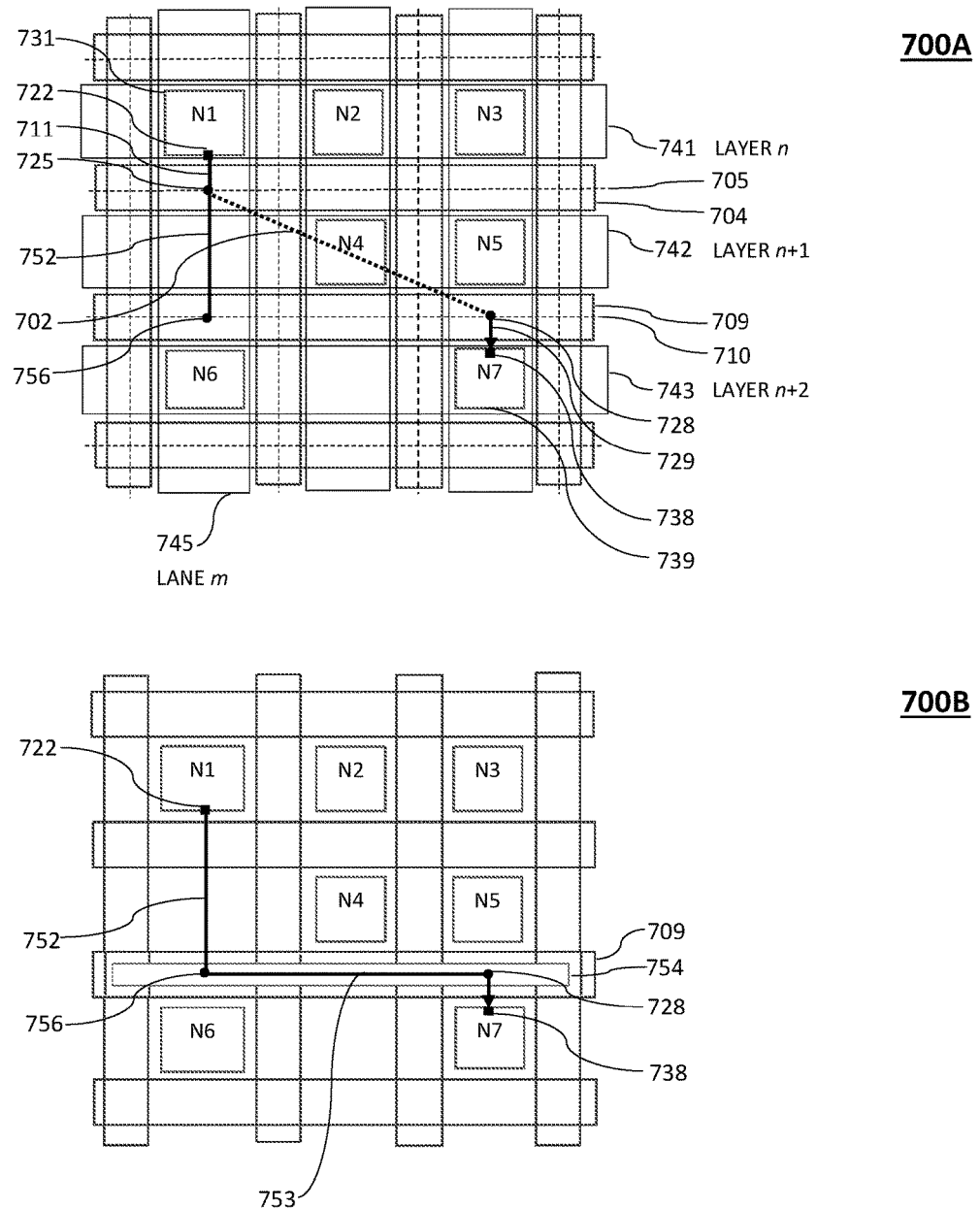
FIG. 7 illustrates another example of routing involving process nodes, in accordance with at least one embodiment.

FIG. 7 700A-B illustrate another example of routing involving process nodes, in accordance with at least one embodiment. As shown in graphical representation 700A, initially a source segment handle 711 and a target segment handle 729 have been created for edge connection 702 between node 731 (N1) and node 739 (N7). Source segment handle 711 begins at output port 722 of node 731 (N1) and extends to source anchor point 725 on main median line 705 of layer pipe 704, and target segment handle 729 begins at target anchor point 728 on main median line 710 of layer pipe 709 and extends to input port 738 of node 739 (N7). Further analysis shows that (a) the number of layers between source layer 741 (LAYER n) and target layer 743 (LAYER n+2) is greater than zero, and (b) the cell at layer 742 (LAYER n+1) and source lane 745 (LANE m) is empty. This allows for source anchor point 725 to be moved to a new source anchor point 756 on main median line 710 of layer pipe 709 and source lane 745 (LANE m). As a result a new source segment handle 752 now begins at output port 722 of node 731 (N1) and extends to the new source anchor point 756. Graphical representation 700B shows the final results of the computational steps when applying Dijkstra's algorithm to obtain the shortest path between source anchor point 756 and target anchor point 728. The edge that has been created includes one new segment 753. The new segment 753 becomes assigned to layer pipe 709. A new segment track 754 is created in layer pipe 709 and the new segment 753 is positioned on segment track 754.

Figure 8:
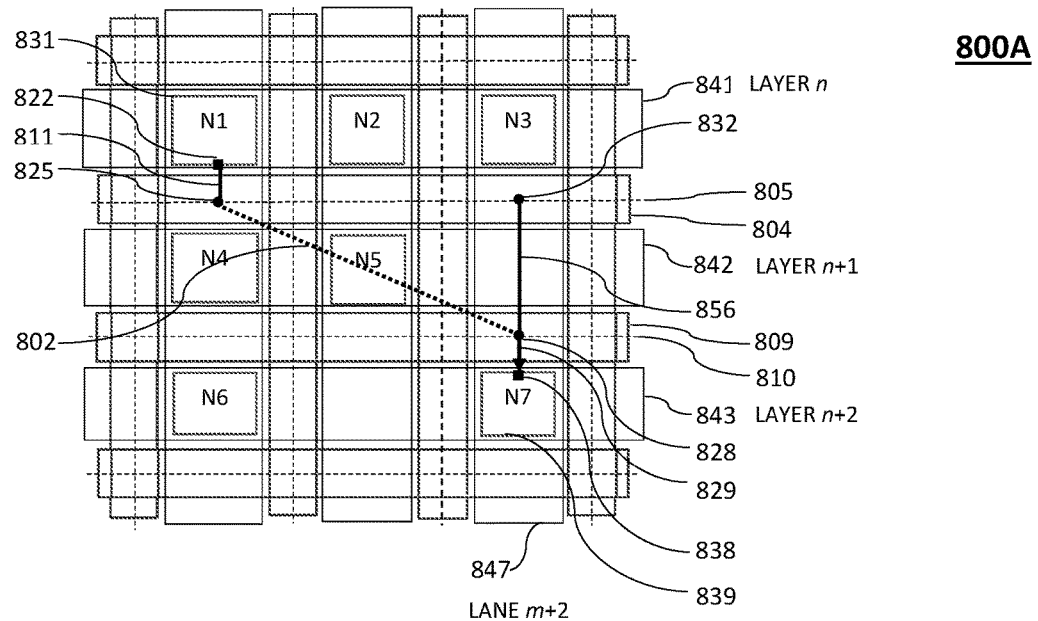
FIG. 8 illustrates another example of routing involving process nodes, in accordance with at least one embodiment.
Figure 8:
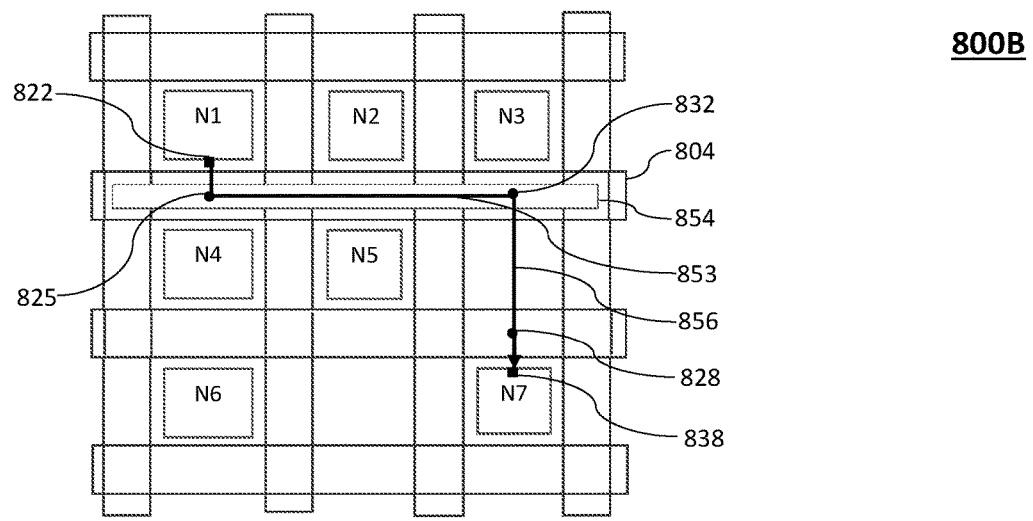

FIG. 8 800A-B illustrate another example of routing involving process nodes, in accordance with at least one embodiment. As shown in graphical representation 800A, initially a source segment handle 811 and a target segment handle 829 have been created for edge connection 802 between node 831 (N1) and node 839 (N7). Source segment handle 811 begins at output port 822 of node 831 (N1) and extends to source anchor point 825 on main median line 805 of layer pipe 804, and target segment handle 829 begins at target anchor point 828 on main median line 810 of layer pipe 809 and extends to input port 838 of node 839 (N7). Further analysis shows that (a) the number of layers between source layer 841 (LAYER n) and target layer 843 (LAYER n+2) is greater than zero, and (b) the cell at layer 842 (LAYER n+1) and target lane 847 (LANE m+2) is empty. This allows for target anchor point 828 to be moved to a new target anchor point 832 on main median line 805 of layer pipe 804 and target lane 847 (LANE m+2). As a result a new target segment handle 856 now begins at the new location of target anchor point 832 and extends to input port 838 of node 839 (N7). Graphical representation 800B shows the final results of the computational steps when applying Dijkstra's algorithm to obtain the shortest path between source anchor point 825 and target anchor point 832. The edge that has been created includes one new segment 853. The new segment 853 becomes assigned to layer pipe 804. A new segment track 854 is created in layer pipe 804 and the new segment 853 is positioned on segment track 854.

Figure 9:
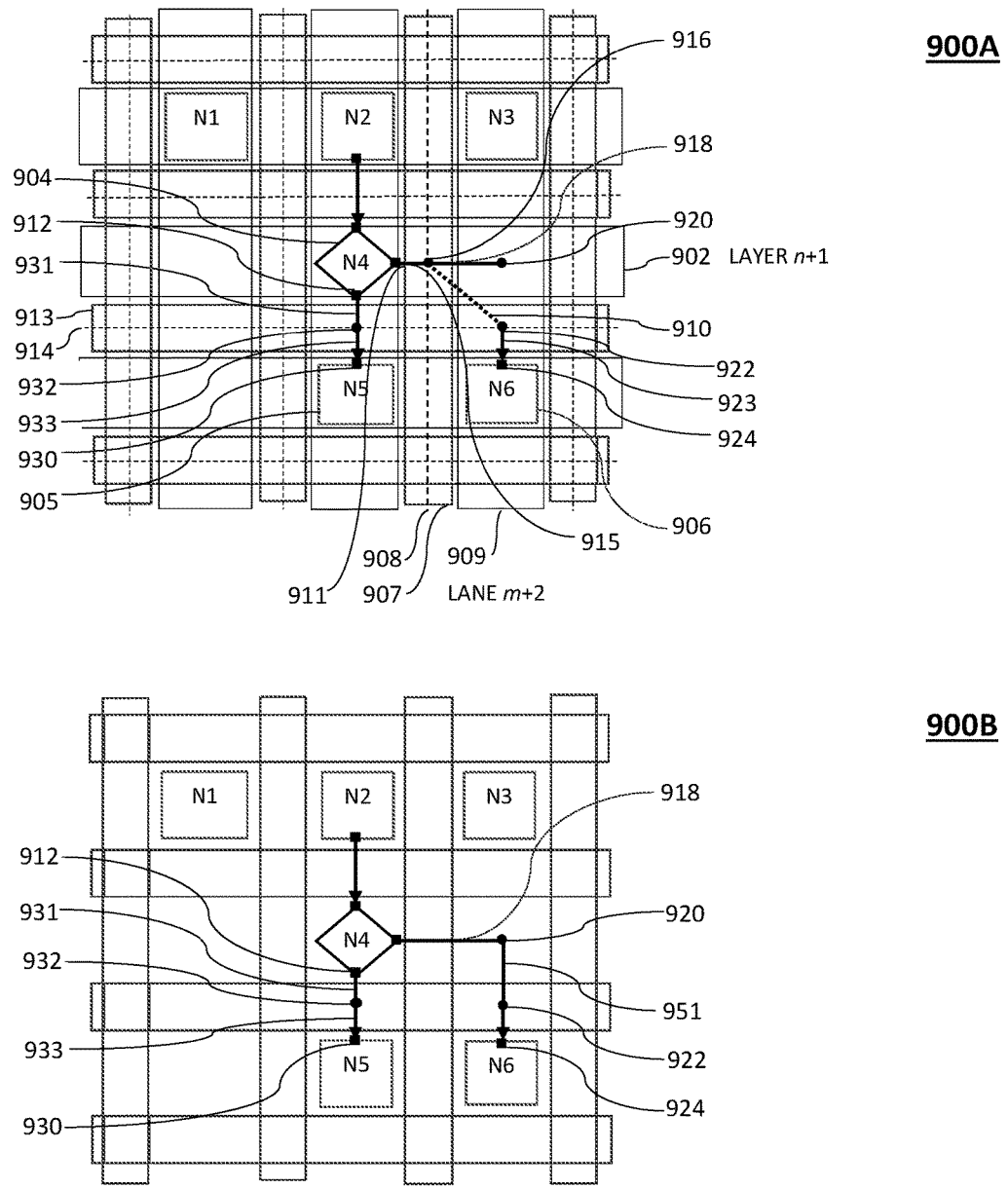
FIG. 9 illustrates an example of routing involving decision nodes, in accordance with at least one embodiment.

FIG. 9 900A-B illustrate one example of routing involving decision nodes, in accordance with at least one embodiment. As shown in graphical representation 900A, initially a source segment handle 915 and a target segment handle 923 have been created for edge connection 910 between decision node 904 (N4) and node 906 (N6). Source segment handle 915 begins at output port 911 of decision node 904 (N4) and extends to source anchor point 916 on main median line 908 of lane pipe 907, and target segment handle 923 begins at target anchor point 922 on main median line 914 of layer pipe 913 and extends to input port 924 of node 906 (N6). Further analysis shows that the cell at layer 902 (LAYER n+1) and lane 909 (LANE m+2) is empty. This allows for source anchor point 922 to be moved to a new source anchor point 920. A new source segment handle 918 now begins at output port 911 of decision node 904 (N4) and extends to the new source anchor point 920. Graphical representation 900B shows the final results of the computational steps when applying Dijkstra's algorithm to obtain the shortest path between source anchor point 920 and target anchor point 922. The edge that has been created includes one new segment 951.

In graphical representation 900A, output port 912 of decision node 904 (N4) is connected to input port 930 of node 905 (N5). Since decision node 904 (N4) and node 905 (N5) are adjacent to each other, a shared anchor point 932 is created as both source anchor point and target anchor point. A source segment handle 931 begins at output port 912 and extends to the shared anchor port 932, and a target segment handle 933 begins at the shared anchor point 932 and extends to input port 930. In this case the routing of this edge is finished.

Figure 10:
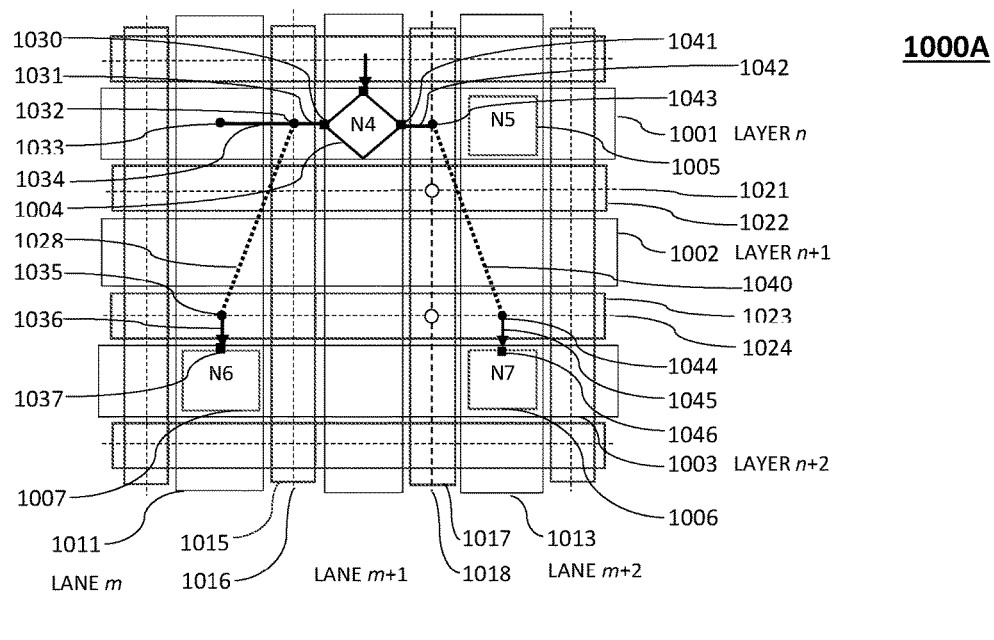
FIG. 10 illustrates another example of routing involving decision nodes, in accordance with at least one embodiment.
Figure 10:
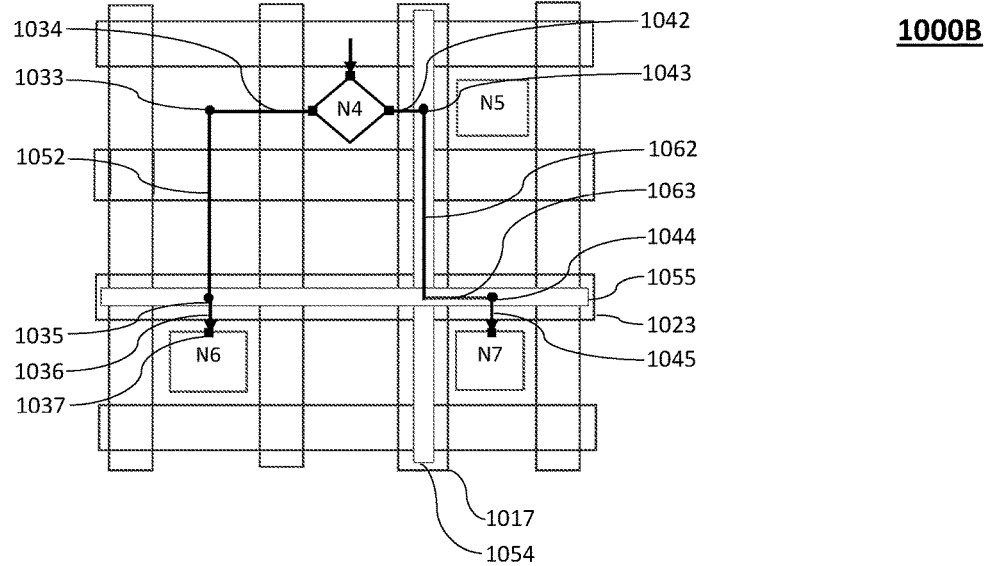

FIG. 10 1000A-B illustrate another example of routing involving decision nodes, in accordance with at least one embodiment. As shown in graphical representation 1000A, initially a source segment handle 1031 and a target segment handle 1036 have been created for edge connection 1028 between decision node 1004 (N4) and node 1007 (N6). Source segment handle 1031 begins at output port 1030 of decision node 1004 (N4) and extends to source anchor point 1032 at main median line 1016 of lane pipe 1015, and target segment handle 1036 begins at target anchor point 1035 at main median line 1024 of layer pipe 1023 and extends to input port 1037 of node 1007 (N6). Further analysis shows that (a) the number of layers between source layer 1001 (LAYER n) and target layer 1003 (LAYER n+2) is greater than zero, and (b) the cells at layer 1001 (LAYER n) through layer 1002 (LAYER n+1) and target LANE m 1011 are empty. This allows for source anchor point 1032 to be moved to a new source anchor point 1033. A new source segment handle 1034 now begins at output port 1030 of decision node 1004 (N4) and extends to the new location of source anchor point 1033. Graphical representation 1000B shows the final results of the computational steps when applying Dijkstra's algorithm to obtain the shortest path between source anchor point 1033 and target anchor point 1035. The edge that has been created includes a new segment 1052.

In graphical representation 1000A, output port 1041 of decision node 1004 (N4) is connected to input port 1046 of node 1006 (N7). A source segment handle 1042 begins at output port 1041 of decision node N4 1004 and extends to source anchor point 1043 at main median line 1018 of lane pipe 1017, and a target segment handle 1045 begins at target anchor point 1044 at main median line 1024 of layer pipe 1023 and extends to input port 1046 of node 1006 (N7). Since node 1005 (N5) occupies the neighboring cell at layer 1001 (LAYER n) and lane 1013 (LANE m+2), the locations of source anchor point 1043 and target anchor point 1044 do not change. Graphical representation 1000B shows the final results of the computational steps when applying Dijkstra's algorithm to obtain the shortest path between source anchor point 1043 and target anchor point 1044. The edge that has been created includes new segment 1062 and new segment 1063. The new segment 1062 becomes assigned to layer pipe 1017. A new segment track 1054 is created in layer pipe 1017 and segment 1062 is positioned on segment track 1054. The new segment 1063 becomes assigned to layer pipe 1023. A new segment track 1055 is created in layer pipe 1023 and segment 1063 is positioned on segment track 1055.

As described in the above illustrated embodiments of the presented method, the final step of the procedure for routing an edge is to position the created segments on the segment tracks in the pipes they are assigned to, along the calculated shortest path. At this point the locations of some anchor points may change. The initial anchor points are always positioned on the main median lines of the corresponding pipes. After the shortest path is calculated, the locations of the anchor points need to be adjusted with respect to the segment tracks on which the adjacent segments are positioned. In case there is a single segment track in a pipe, the segment track coincides with the main median line of the pipe and the location of the anchor point does not change. Otherwise the anchor point is reallocated on the respective segment track.

Figure 11:
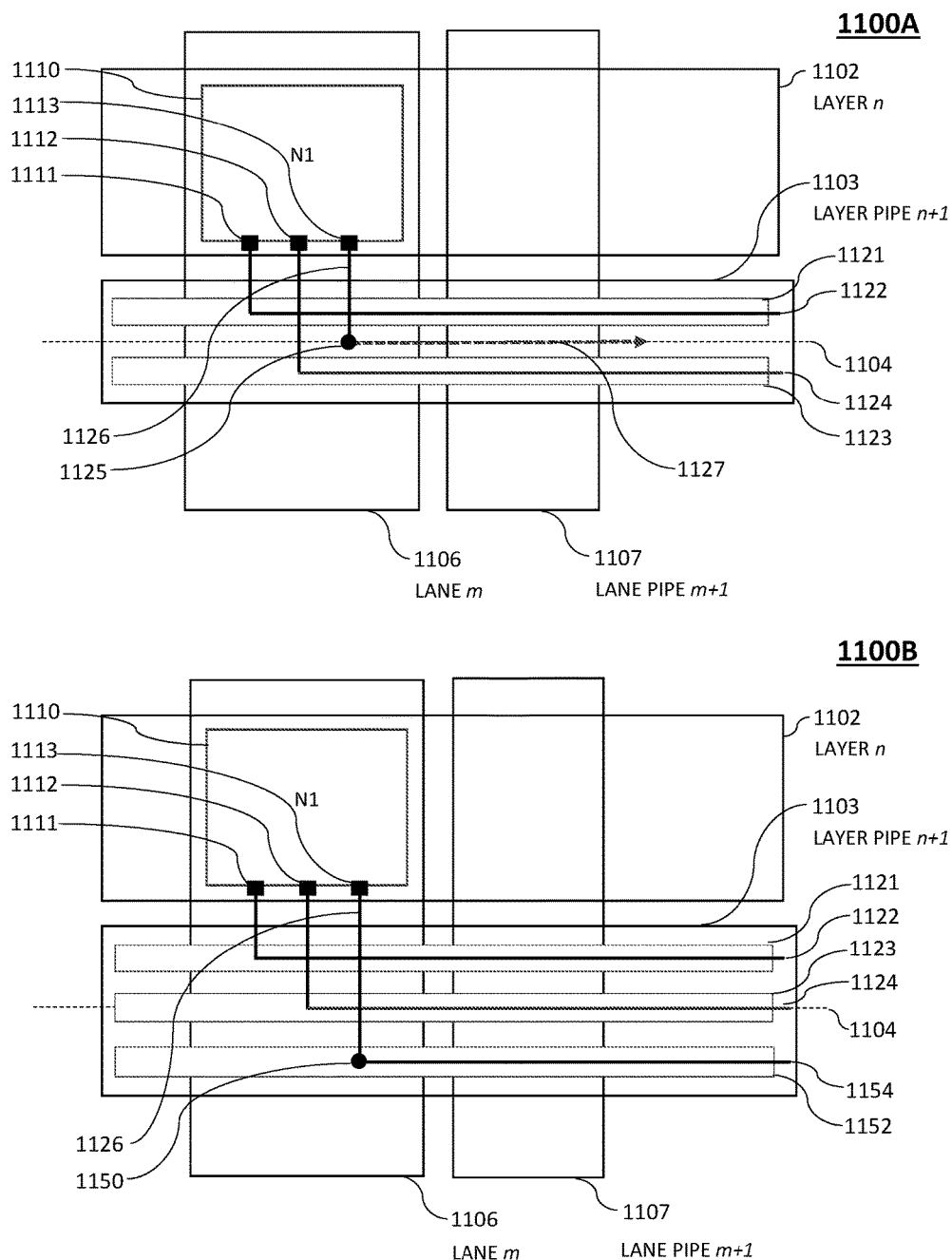
FIG. 11 illustrates an example of anchor point reallocation in the case of multiple segment tracks in a pipe, in accordance with at least one embodiment.

FIG. 11 1100A-B illustrate an example of anchor point reallocation in case of multiple segment tracks in a pipe, in accordance with at least one embodiment. Graphical representation 1100A shows part of a diagram with layer 1102 (LAYER n), layer pipe 1103 (LAYER PIPE n+1), lane 1106 (LANE m), lane pipe 1107 (LANE PIPE n+1), and node 1110 (N1) positioned at layer 1102 (LAYER n) and lane 1106 (LANE m). Edges 1122 and 1124 have already been routed. Edge 1122 is routed starting from output port 1111 of node 1110 (N1) and is laid out along segment track 1121 of layer pipe 1103 (LAYER PIPE n+1), and edge 1124 is routed starting from output port 1112 of node 1110 (N1) and is laid out along segment track 1123 of layer pipe 1103 (LAYER PIPE n+1). As shown in graphical representation 1100A, edge connection 1127 is in the process of routing. Output port 1113 has been created and added to node 1110 (N1). An anchor point 1125 for a source segment handle 1126 has been positioned on main median line 1104 of layer pipe 1103 (LAYER PIPE n+1). Source segment handle 1126 starts at output port 1113 and extends to anchor point 1125.

Graphical representation 1100B is similar to graphical representation 1100A, except that edge connection 1127 has been routed already. As an outcome of the computational steps when applying Dijkstra's algorithm to obtain the shortest path, a new segment track 1152 has been created in layer pipe 1103 (LAYER PIPE n+1) and a new segment 1154 has been positioned on it. Since the segments of an edge are chained, as disclosed before, anchor point 1125 becomes a shared point 1150 between source segment handle 1126 and its adjacent new segment 1154. The location of the new segment 1154 is determined by the new segment track 1152. As a result of this, shared point 1150 is relocated on the new segment track 1152.

In all previous examples the segment tracks are shown wider for illustration purposes only. As disclosed before, the segment tracks do not have their own physical width. The width of a pipe is calculated as:

$$W = D + N \times (T + D)$$

Here D is the predetermined distance between parallel segments, T is the predetermined thickness of segments, and N is the number of segment tracks in the pipe. When N is zero, which is the case when no segments are assigned to the pipe, the width of the empty pipe is equal to the predetermined distance D between parallel segments.

Figure 12:
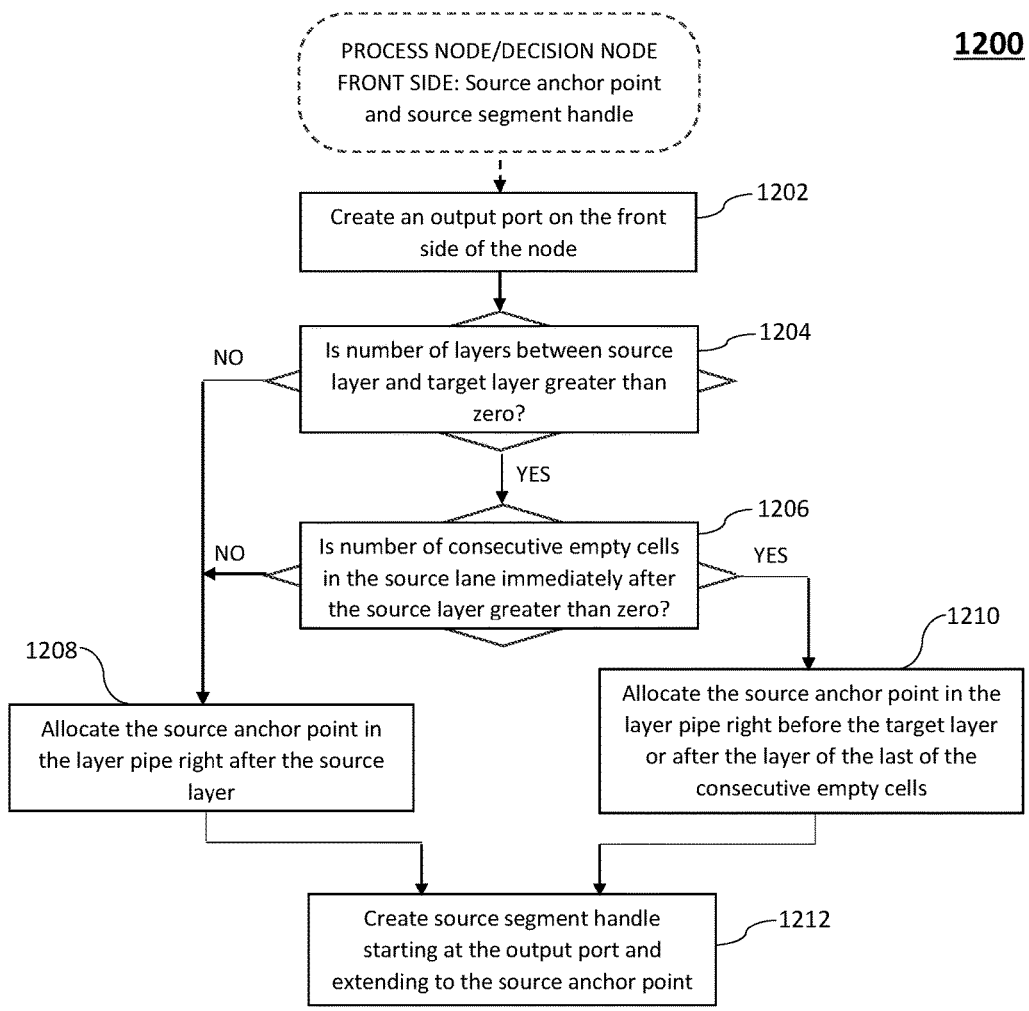
FIG. 12 is a flowchart that illustrates an example procedure for creating a source anchor point and a source segment handle for a process node or for a decision node, in accordance with at least one embodiment.
Figure 13:
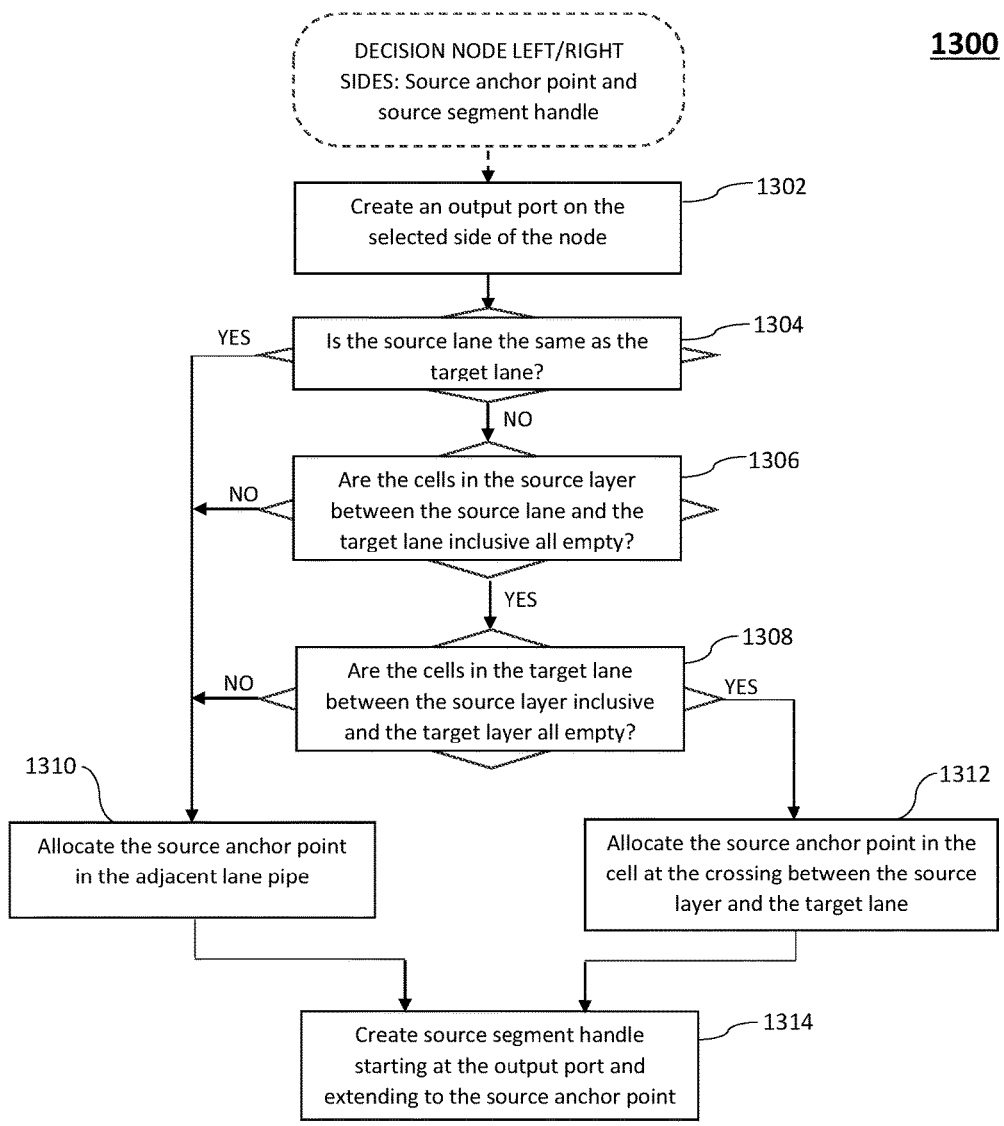
FIG. 13 is a flowchart that illustrates an example procedure for creating a source anchor point and a source segment handle for a decision node, in accordance with at least one embodiment.
Figure 14:
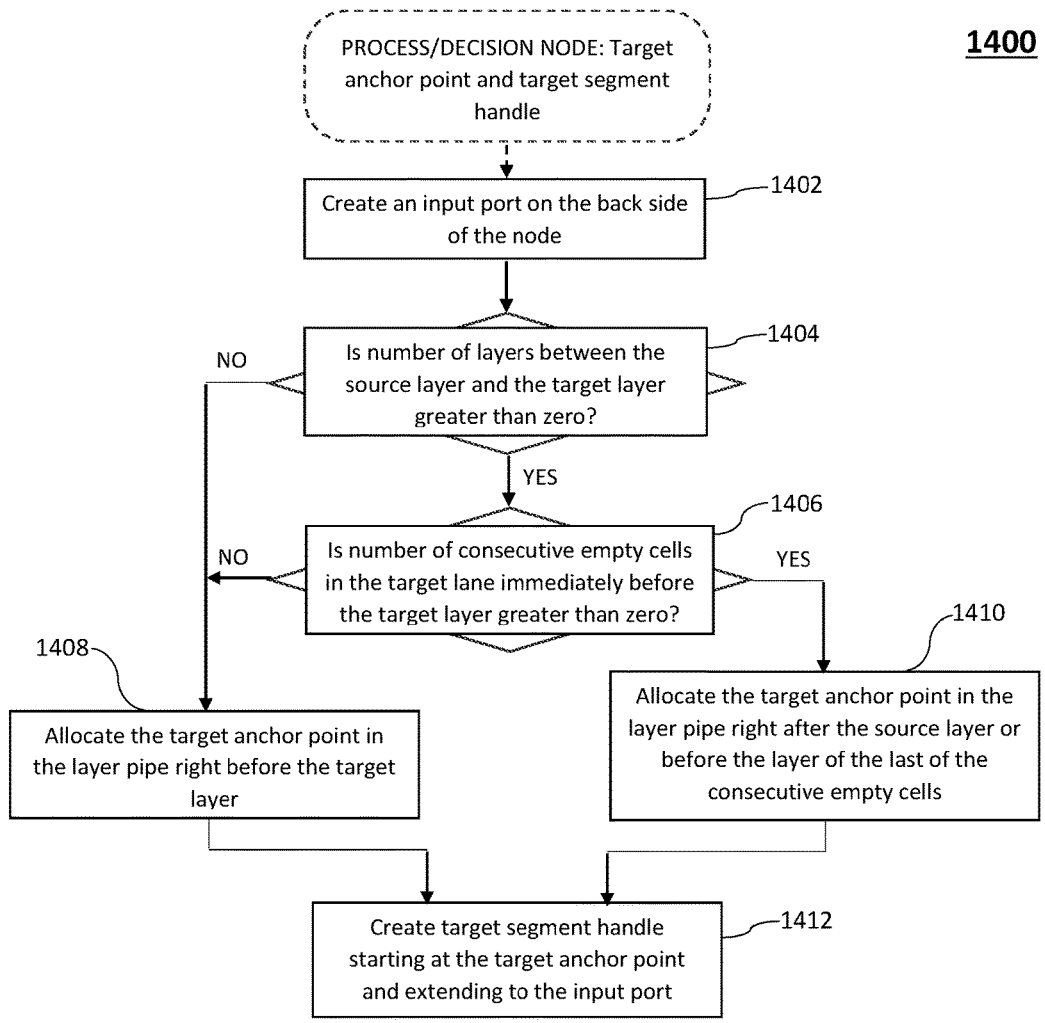
FIG. 14 is a flowchart that illustrates an example procedure for creating a target anchor point and a target segment handle for a process node or for a decision node, in accordance with at least one embodiment.
Figure 15:
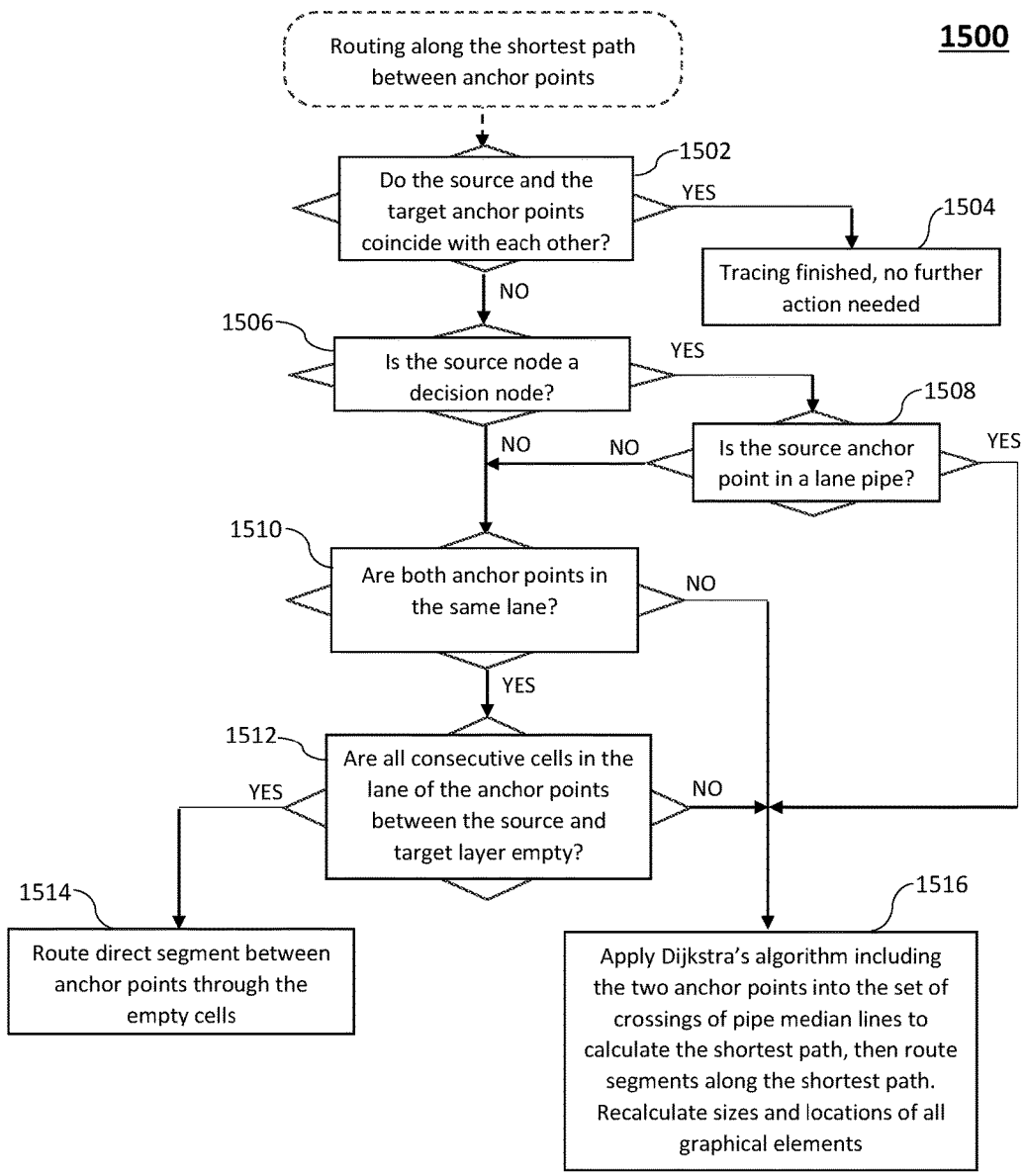
FIG. 15 is a flowchart that illustrates an example procedure for routing the segments between two anchor points along the shortest path, in accordance with at least one embodiment.
Figure 16:
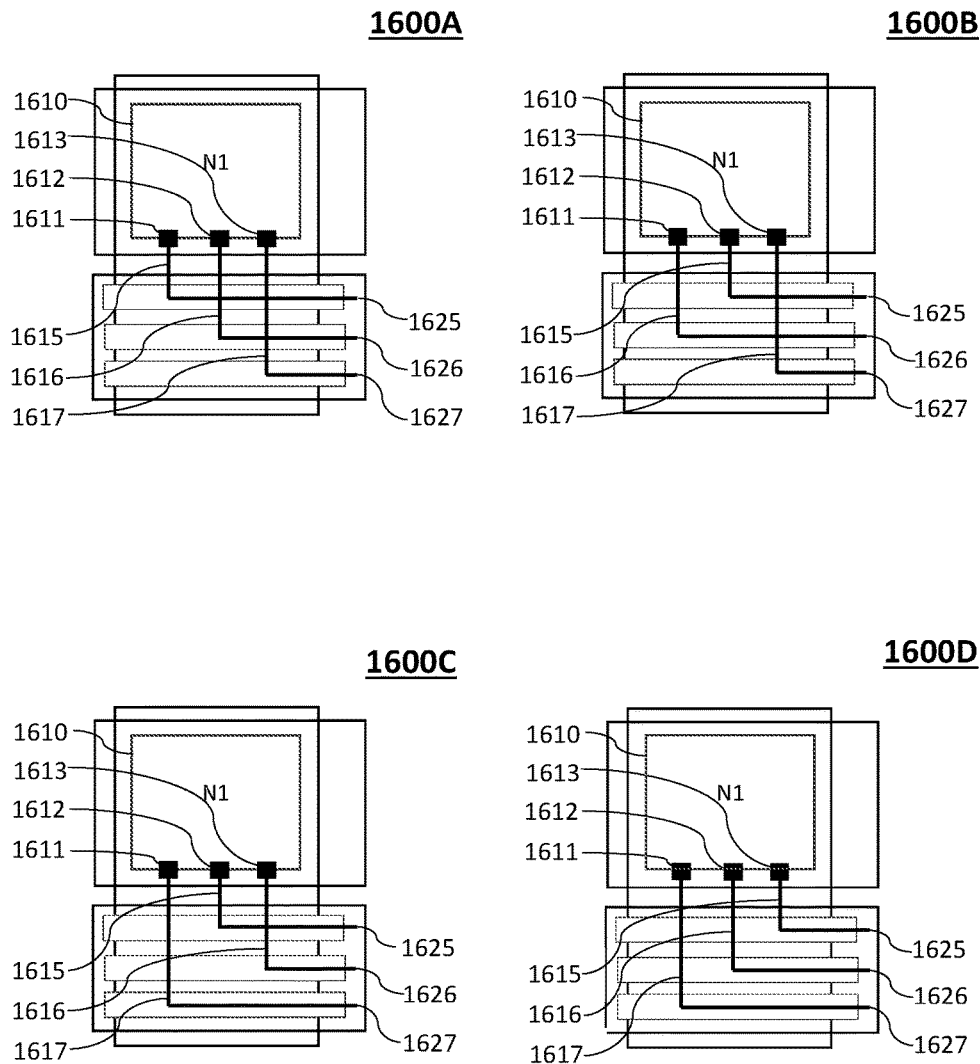
FIG. 16 illustrates an example of intersections between source segment handles and segments adjacent to their sibling source segment handles, in accordance with at least one embodiment.

The flowcharts in FIGS. 12-14 provide examples of the procedures for creating both source and target anchor points and subsequently the segment handles, according to various embodiments. The flowchart in FIG. 15 provides an example of the procedures for routing the segments between source and target anchor points, according to various embodiments.

The flowchart in FIG. 12 illustrates an example procedure 1200 for creating a source anchor point and a source segment handle for a process node or for a decision node with an output port located on the front side of the node, in accordance with at least one embodiment. The first step 1202 is to create an output port on the front side of the node. A decision node can have only one single output port on its front side. A process node can have multiple output ports, so a new output port is added on its front side. Next comes analysis 1204 to find out whether the number of layers between the source layer and the target layer is greater than zero. If it is determined that this number is greater than zero, the next analysis 1206 is to find out whether the number of consecutive empty cells in the source lane immediately after the source layer is greater than zero. If it is determined that this number is greater than zero, the next step 1210 is to position a source anchor point on the main median line of the layer pipe right before the target layer or after the layer of the last of the consecutive empty cells. That is the case with anchor point 626 discussed in relation to FIG. 6 and with anchor point 756 discussed in relation to FIG. 7. If the result of the analysis 1204 is negative (no intermediate layers between the source and the target layers), or if the result of the analysis 1206 is negative (no empty cells in the source lane immediately after the source layer), the next step 1208 is to position a source anchor point on the main median line of the layer pipe right after the source layer. That is the case with the shared anchor point 932 discussed in relation to FIG. 9. Once the source anchor point is defined from either 1210 or 1208, the next step 1212 is to create a source segment handle starting at the output port and ending at the source anchor point.

The flowchart in FIG. 13 illustrates an example procedure 1300 for creating a source anchor point and a source segment handle for a decision node with output ports located on the left side or on the right side of the decision node, in accordance with at least one embodiment. The first step 1302 is to create an output port on the selected side of the node—left or right. Next comes analysis 1304 to find out whether the source lane is the same as the target lane. If it is determined that the source lane and the target lane are different, the next analysis 1306 is to find out whether all of the cells in the source layer between the source lane and the target lane inclusive are empty. If it is determined that these cells are empty, the next analysis 1308 is to find out whether all the cells in the target lane between the source layer inclusive and the target layer are empty. If it is determined that these cells are empty, the next step 1312 is to position a source anchor point in the cell at the crossing between the source layer and the target lane. That is the case with anchor point 920 discussed in relation to FIG. 9 and with anchor point 1033 discussed in relation to FIG. 10. If the result of analysis 1304 is positive (source lane and target lane are the same), or if the result of analysis 1306 is negative (no empty cells in the source layer between the source lane and the target lane inclusive), or if the result of analysis 1308 is negative (no empty cells in the target lane between the source layer inclusive and the target lane), the next step 1310 is to position a source anchor point on the main median line of the lane pipe adjacent to the node. That is the case with anchor point 1043 discussed in relation to FIG. 10. Once the source anchor point is defined from either 1312 or 1310, the next step 1314 is to create a source segment handle starting at the output port and ending at the source anchor point.

The flowchart in FIG. 14 illustrates an example procedure 1400 for creating a target anchor point and a target segment handle for a process node or for a decision node with the input port located on the back side of the node, in accordance with at least one embodiment. The first step 1402 is to create an input port on the back side of the node. A decision node can have only one single input port on its back side. A process node can have multiple input ports, so a new input port is added on its back side. Next comes analysis 1404 to find out whether the number of layers between the source layer and the target layer is greater than zero. If it is determined that this number is greater than zero, the next analysis 1406 is to find out whether the number of the consecutive empty cells in the target lane immediately before the target layer is greater than zero. If it is determined that this number is greater than zero, the next step 1410 is to position a target anchor point on the main median line of the layer pipe right after the source layer or before the layer of the last of the consecutive empty cells. That is the case with anchor point 832 discussed in relation to FIG. 8. If the result of analysis 1404 is negative (no intermediate layers between the source and the target layers), or if the result of analysis 1406 is negative (no empty cells in the target lane immediately before the target layer), the next step 1408 is to position a target anchor point on the main median line of the layer pipe right before the target layer. That is the case with the shared anchor point 932 discussed in relation to FIG. 9. Once the target anchor point is defined from either 1410 or 1408, the next step 1412 is to create a target segment handle starting at the target anchor point and ending at the input port.

The flowchart in FIG. 15 illustrates an example procedure 1500 for routing the segments between two anchor points along the shortest path, in accordance with at least one embodiment. The first step is analysis 1502 to find out whether the source and the target anchor points coincide with each other. If the result is positive, the tracing of this edge is finished 1504. Such are the cases with the shared anchor point 626 discussed in relation to FIG. 6 and the shared anchor point 932 discussed in relation to FIG. 9. If the result of analysis 1502 is negative, the next analysis 1506 is to find out whether the source node is a decision node. If the result of this analysis is positive, the next analysis 1508 is to find out whether the source anchor point is located in a lane pipe (in which case the output port of the decision node will be on the left side or on the right side). If the result of this analysis is negative or the result of analysis 1506 is negative, the next analysis 1510 is to find out whether both source and target anchor points are in the same lane. If the result is positive, the next analysis 1512 is to find out whether all consecutive cells in the lane of the anchor points between the source layer and the target layer are empty. If the result is positive, then the next step 1514 is to connect the two anchor points directly with a segment across the empty cells. Such are the cases with segment 951 discussed in relation to FIG. 9 and segment 1052 discussed in relation to FIG. 10. If the result of analysis 1508 is positive (the source anchor point is in a lane pipe), or the result of analysis 1510 is negative (anchor points are not in the same lane), or the result of analysis 1512 is negative (not all consecutive cells in the anchor lane between the source layer and the target layer are empty), then the next step 1516 is to include the two anchor points into the set of crossings between the main median lines of the pipes. Dijkstra's algorithm is applied to this set in order to calculate the shortest path between these two anchor points. Consequently, new segments are created along the resulting shortest path. Such are the cases with segments 451, 452 and 453 discussed in relation to FIG. 4, with segments 544, 545 and 546 discussed in relation to FIG. 5, with segment 753 discussed in relation to FIG. 7, with segment 853 discussed in relation to FIG. 8, and with segments 1062 and 1063 discussed in relation to FIG. 10.

D. Crossings Reduction

As demonstrated in the previous examples, the presented method excludes the possibility for the edges to cross graph nodes and guarantees the spacing between nodes and edges, as well as the spacing between adjacent segment tracks within the pipes. Moreover, the embodiments of the presented method provide the advantages allowing: (a) to swap segment handles between the ports they are attached to, and (b) to reposition segments on different parallel segment tracks, by preserving at the same time the chains of the segments that constitute the respective edges.

In embodiments of the presented method, crossings reduction component 116 performs an examination of the created set of edges for crossings. The objective of this analysis is to detect the intersections between segments. The analysis is performed iteratively by steps where each step includes instant actions to fix the detected intersections. The intersections between segments are eliminated either by swapping segment handles, or by repositioning segments on different parallel segment tracks, as disclosed below.

In some embodiments the crossings reduction is performed by the following procedures in this order: (a) iterative detection and fixing of the intersections between source segment handles and segments adjacent to their sibling source segment handles, (b) iterative detection and fixing of the intersections between target segment handles and segments adjacent to their sibling target segment handles, and (c) iterative detection and fixing of the intersections between segments in pipes and segments adjacent to other segments in same pipes. These procedures are repeated in this order under the conditions disclosed below.

FIG. 16 1600A-D illustrate an example of intersections between source segment handles and segments adjacent to their sibling source segment handles, in accordance with at least one embodiment. Graphical representation 1600A shows the results of the routing procedures related to node 1610 (N1). First, output port 1611 was created, then source segment handle 1615 was created and an edge containing segment 1625 was routed. Next, output port 1612 was created, then source segment handle 1616 was created and an edge containing segment 1626 was routed. Next, output port 1613 was created, then source segment handle 1617 was created and an edge containing segment 1627 was routed.

The analysis of the first iteration through the set of source segment handles discovers that segment 1625, adjacent to the first source segment handle 1615, intersects with the second source segment handle 1616. The immediate actions to eliminate this intersection are: (a) detach source segment handle 1615 from output port 1611, (b) detach source segment handle 1616 from output port 1612, (c) reattach source segment handle 1615 to output port 1612, (d) reattach source segment handle 1616 to output port 1611, and (e) recalculate the locations of all segments. The result is shown in graphical representation 1600B.

The analysis of the next iteration through the set of source segment handles discovers that segment 1626, adjacent to the first source segment handle 1616, intersects with the third source segment handle 1617. The immediate actions to eliminate this intersection are: (a) detach source segment handle 1616 from output port 1611, (b) detach source segment handle 1617 from output port 1613, (c) reattach source segment handle 1616 to output port 1613, (d) reattach source segment handle 1617 to output port 1611, and (e) recalculate the locations of all segments. The result is shown in graphical representation 1600C.

The analysis of the next iteration through the set of source segment handles discovers that segment 1625, adjacent to the second source segment handle 1615, intersects with the third source segment handle 1616. The immediate actions to eliminate this intersection are: (a) detach source segment handle 1615 from output port 1612, (b) detach source segment handle 1616 from output port 1613, (c) reattach source segment handle 1615 to output port 1613, (d) reattach source segment handle 1616 to output port 1612, and (e) recalculate the locations of all segments. The result is shown in graphical representation 1600D. The next iteration won't find more intersections at this particular location.

Figure 17:
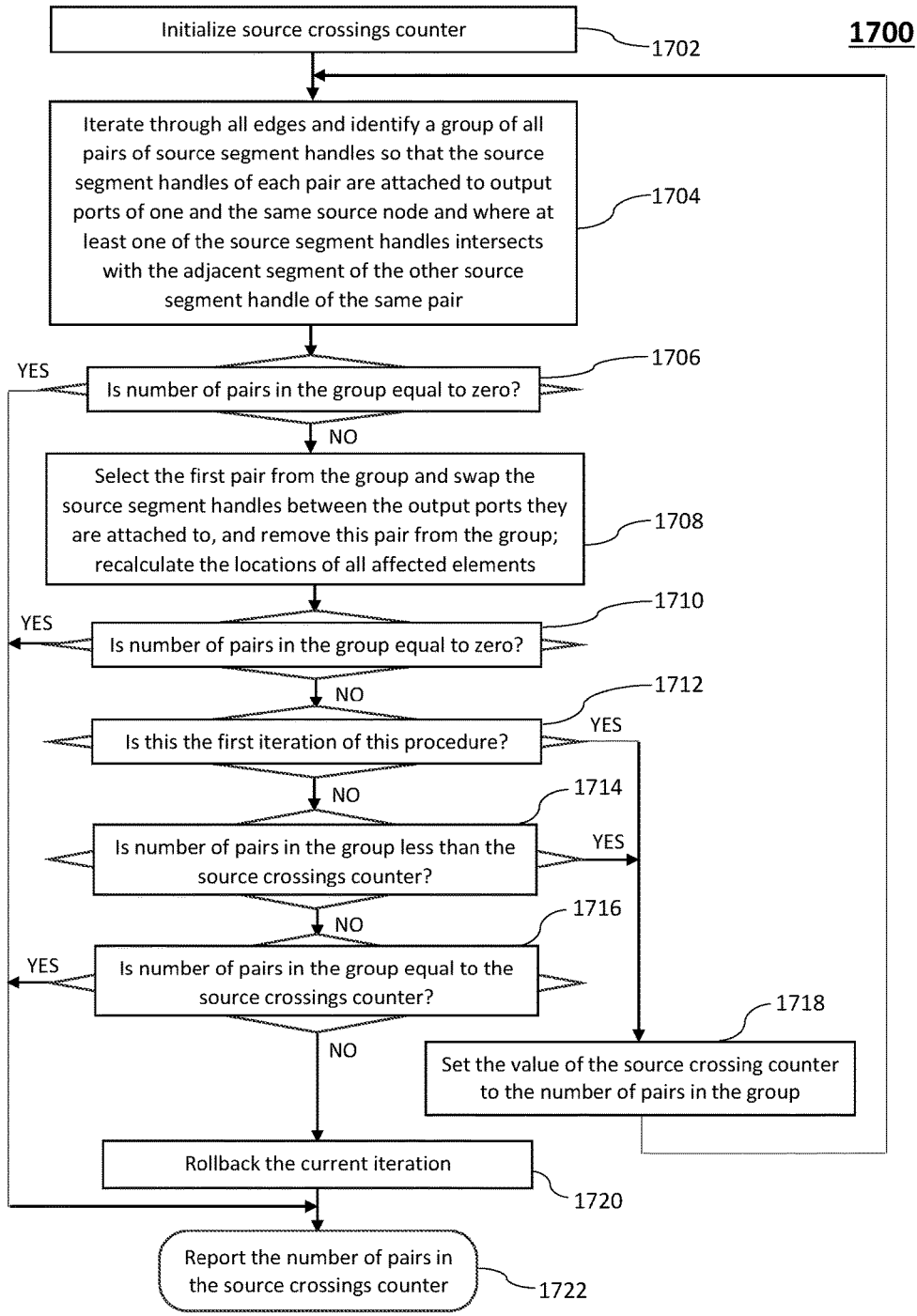
FIG. 17 is a flowchart that illustrates an example procedure for the detection and fixing of intersections between source segment handles and segments adjacent to their sibling source segment handles, in accordance with at least one embodiment.
Figure 18:
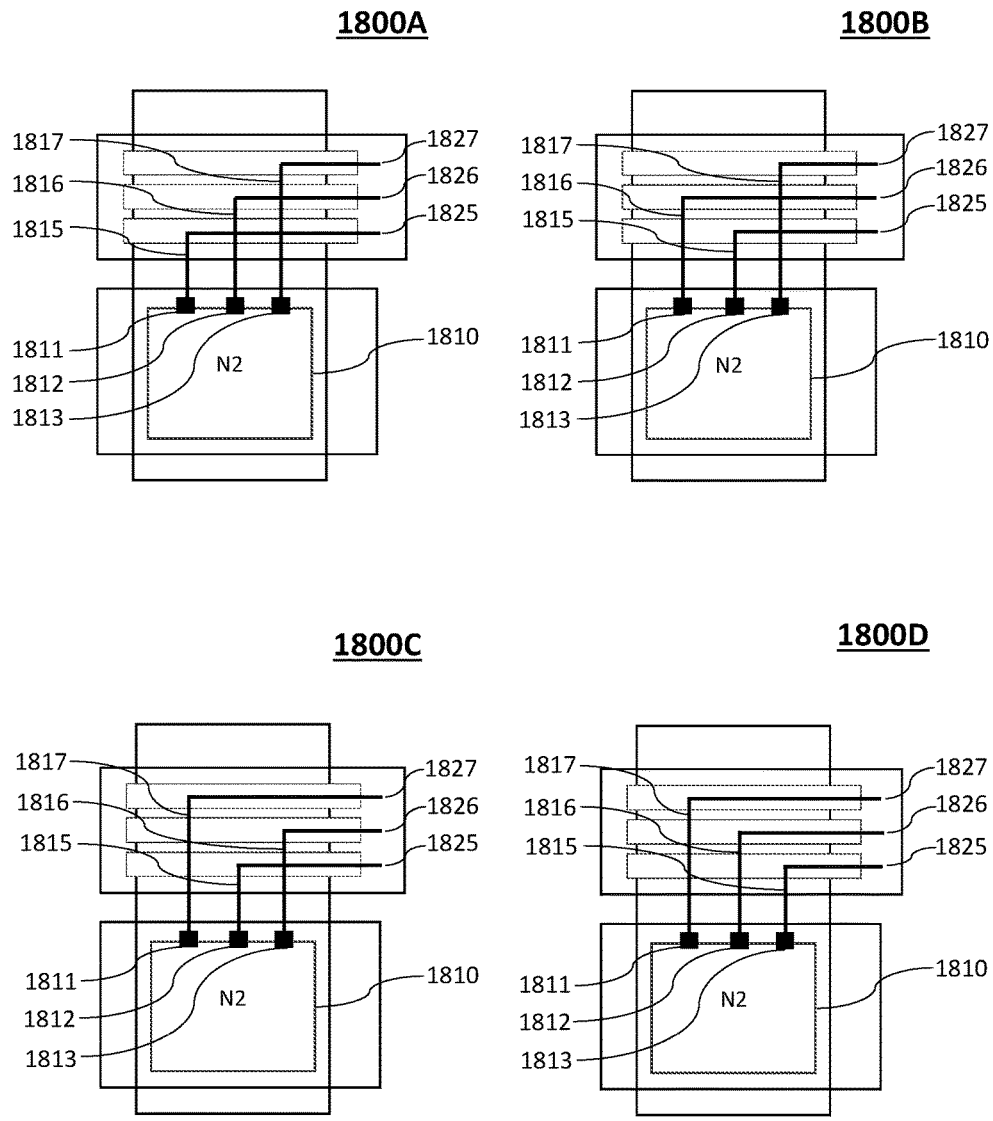
FIG. 18 illustrates an example of intersections between target segment handles and segments adjacent to their sibling target segment handles, in accordance with at least one embodiment.

The flowchart in FIG. 17 illustrates an example procedure 1700 for the detection and fixing of intersections between source segment handles and segments adjacent to their sibling source segment handles, in accordance with at least one embodiment. This procedure is discussed in relation to FIG. 16. The first step 1702 is to initialize a source crossings counter to calculate the intersections. The next step 1704 is to iterate through the set of edges and to identify a source crossings group consisting of zero or more ordered pairs of source segment handles so that the source segment handles of a pair selected from the source crossings group are attached to output ports of one and the same source node and at least one of the source segment handles of the pair intersects with the adjacent segment of the other source segment handle of the pair. The next step 1706 is to check the number of pairs in the source crossings group. If the number of pairs is equal to zero, the procedure ends by reporting 1722 of the zero value. If the number of pairs is greater than zero, the next step 1708 is to select the first pair from the source crossings group and to swap the source segment handles of the first pair between the output ports to which the source segment handles are attached, then to remove said first pair from the source crossings group and to recalculate the locations of all affected graphical elements. The next step 1710 is to check the current number of pairs in the source crossings group. If the current number of pairs is equal to zero, the procedure ends by reporting 1722 of the zero value. If the current number of pairs is not equal to zero, the next step 1712 is to check if this is the first iteration of this procedure. If the result is negative (not the first iteration), the next step 1714 is to check if the number of pairs in the source crossings group is less than the value in the source crossings counter. If the result from step 1714 is negative, the next step 1716 is to check if the number of pairs in the source crossings group is equal to the value in the source crossings counter. If the result from step 1716 is positive, this means that the minimal number of intersections between source segment handles and segments adjacent to their sibling source segment handles is reached, the iterations are ended by reporting 1722 of the number of pairs in the source crossings counter. This number is the actual number of unresolved intersections. If the result from step 1716 is negative, this means that the number of pairs in the source crossings group is greater than the value in the source crossings counter and the minimal number of intersections was detected in the previous iteration. The next step 1720 is to roll back the current iteration to the previous one, and to end the iterations by reporting 1722 of the number of pairs in the source crossings counter. If the result from step 1712 is positive (this is the first iteration of the procedure), or if the result from step 1714 is positive (the number of pairs in the source crossings group is less than the value in the source crossings counter), the next step 1718 is to set the value of the source crossings counter to be equal to the number of pairs in the source crossings group, and to return to step 1704 for the next iteration.

FIG. 18 1800A-D illustrate an example of intersections between target segment handles and segments adjacent to their sibling target segment handles, in accordance with at least one embodiment. Graphical representation 1800A shows the results of the routing procedures related to node 1810 (N2). First, input port 1811 was created, then target segment handle 1815 was created and an edge containing segment 1825 was routed. Next, input port 1812 was created, then target segment handle 1816 was created and an edge containing segment 1826 was routed. Next, input port 1813 was created, then target segment handle 1817 was created and an edge containing segment 1827 was routed.

The analysis of the first iteration through the set of target segment handles discovers that segment 1825, adjacent to the first target segment handle 1815, intersects with the second target segment handle 1816. The immediate actions to eliminate this intersection are: (a) detach target segment handle 1815 from input port 1811, (b) detach target segment handle 1816 from input port 1812, (c) reattach target segment handle 1815 to input port 1812, (d) reattach target segment handle 1816 to input port 1811, and (e) recalculate the locations of all segments. The result is shown in graphical representation 1800B.

The analysis of the next iteration through the set of target segment handles discovers that segment 1826, adjacent to the first target segment handle 1816, intersects with the third target segment handle 1817. The immediate actions to eliminate this intersection are: (a) detach target segment handle 1816 from input port 1811, (b) detach target segment handle 1817 from input port 1813, (c) reattach target segment handle 1816 to input port 1813, (d) reattach target segment handle 1817 to input port 1811, and (e) recalculate the locations of all segments. The result is shown in graphical representation 1800C.

The analysis of the next iteration through the set of target segment handles discovers that segment 1825, adjacent to the second target segment handle 1815, intersects with the third target segment handle 1816. The immediate actions to eliminate this intersection are: (a) detach target segment handle 1815 from input port 1812, (b) detach target segment handle 1816 from input port 1813, (c) reattach target segment handle 1815 to input port 1813, (d) reattach target segment handle 1816 to input port 1812, and (e) recalculate the locations of all segments. The result is shown in graphical representation 1800D. The next iteration won't find more intersections at this particular location.

Figure 19:
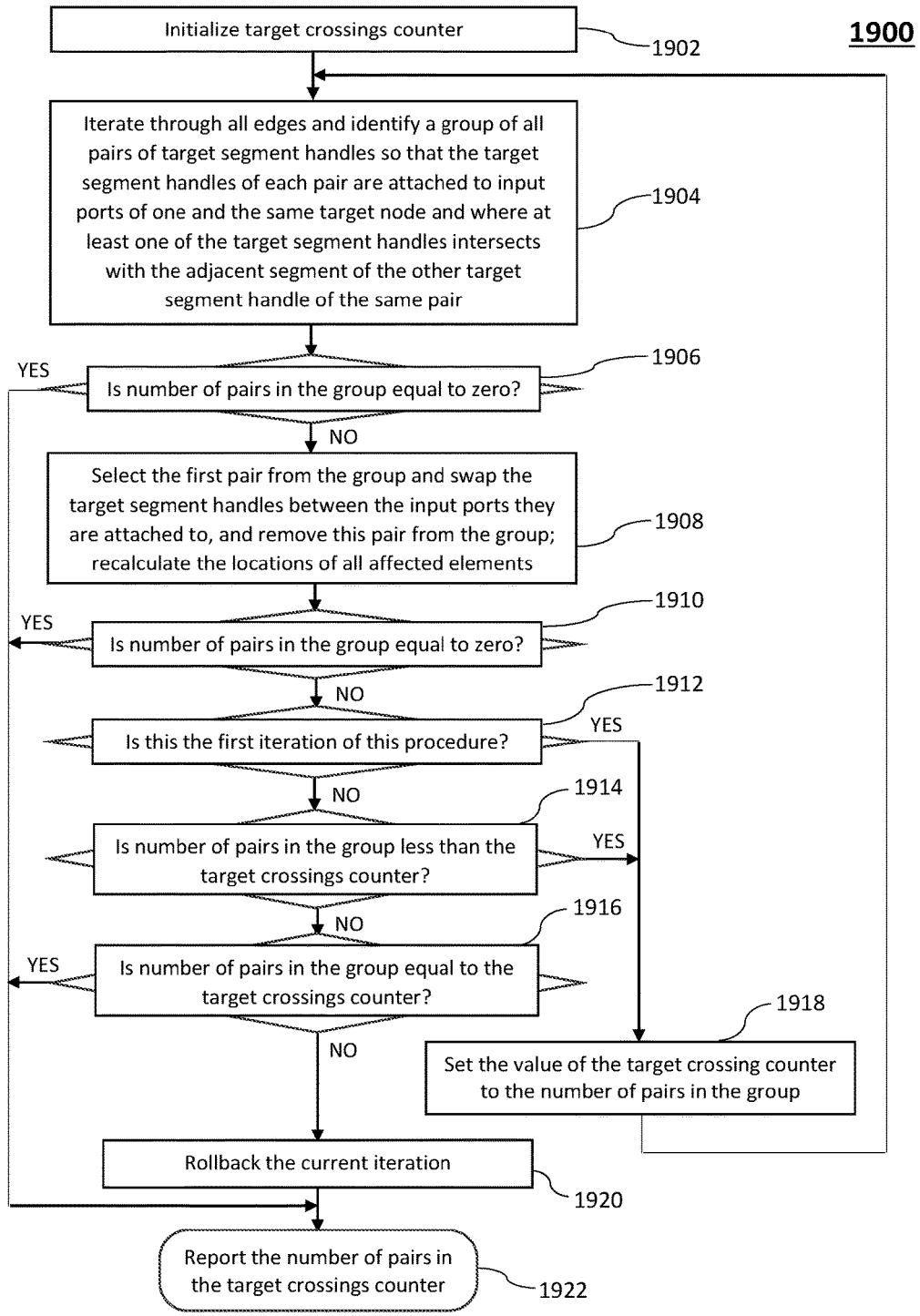
FIG. 19 is a flowchart that illustrates an example procedure for the detection and fixing of intersections between target segment handles and segments adjacent to their sibling target segment handles, in accordance with at least one embodiment.

The flowchart in FIG. 19 illustrates an example procedure 1900 for the detection and fixing of intersections between target segment handles and segments adjacent to their sibling target segment handles, in accordance with at least one embodiment. This procedure is discussed in relation to FIG. 18. The first step 1902 is to initialize a target crossings counter to calculate the intersections. The next step 1904 is to iterate through the set of edges and to identify a target crossings group consisting of zero or more ordered pairs of target segment handles so that the target segment handles of a pair selected from the target crossings group are attached to input ports of one and the same target node and at least one of the target segment handles of the pair intersects with the adjacent segment of the other target segment handle of the pair. The next step 1906 is to check the number of pairs in the target crossings group. If the number of pairs is equal to zero, the procedure ends by reporting 1922 of the zero value. If the number of pairs is greater than zero, the next step 1908 is to select the first pair from the target crossings group and to swap the target segment handles of the first pair between the input ports to which the target segment handles are attached, then to remove said first pair from the target crossings group and to recalculate the locations of all affected graphical elements. The next step 1910 is to check the current number of pairs in the target crossings group. If the current number of pairs is equal to zero, the procedure ends by reporting 1922 of the zero value. If the current number of pairs is not equal to zero, the next step 1912 is to check if this is the first iteration of this procedure. If the result is negative (not the first iteration), the next step 1914 is to check if the number of pairs in the target crossings group is less than the value in the target crossings counter. If the result from step 1914 is negative, the next step 1916 is to check if the number of pairs in the target crossings group is equal to the value in the target crossings counter. If the result from step 1916 is positive, this means that the minimal number of intersections between target segment handles and segments adjacent to their sibling target segment handles is reached, the iterations are ended by reporting 1922 of the number of pairs in the target crossings counter. This number is the actual number of unresolved intersections. If the result from step 1916 is negative, this means that the number of pairs in the target crossings group is greater than the value in the target crossings counter and the minimal number of intersections was detected in the previous iteration. The next step 1920 is to roll back the current iteration to the previous one, and to end the iterations by reporting 1922 of the number of pairs in the target crossings counter. If the result from step 1912 is positive (this is the first iteration of the procedure), or if the result from step 1914 is positive (the number of pairs in the target crossings group is less than the value in the target crossings counter), the next step 1918 is to set the value of the target crossings counter to be equal to the number of pairs in the target crossings group, and to return to step 1904 for the next iteration.

Figure 20:
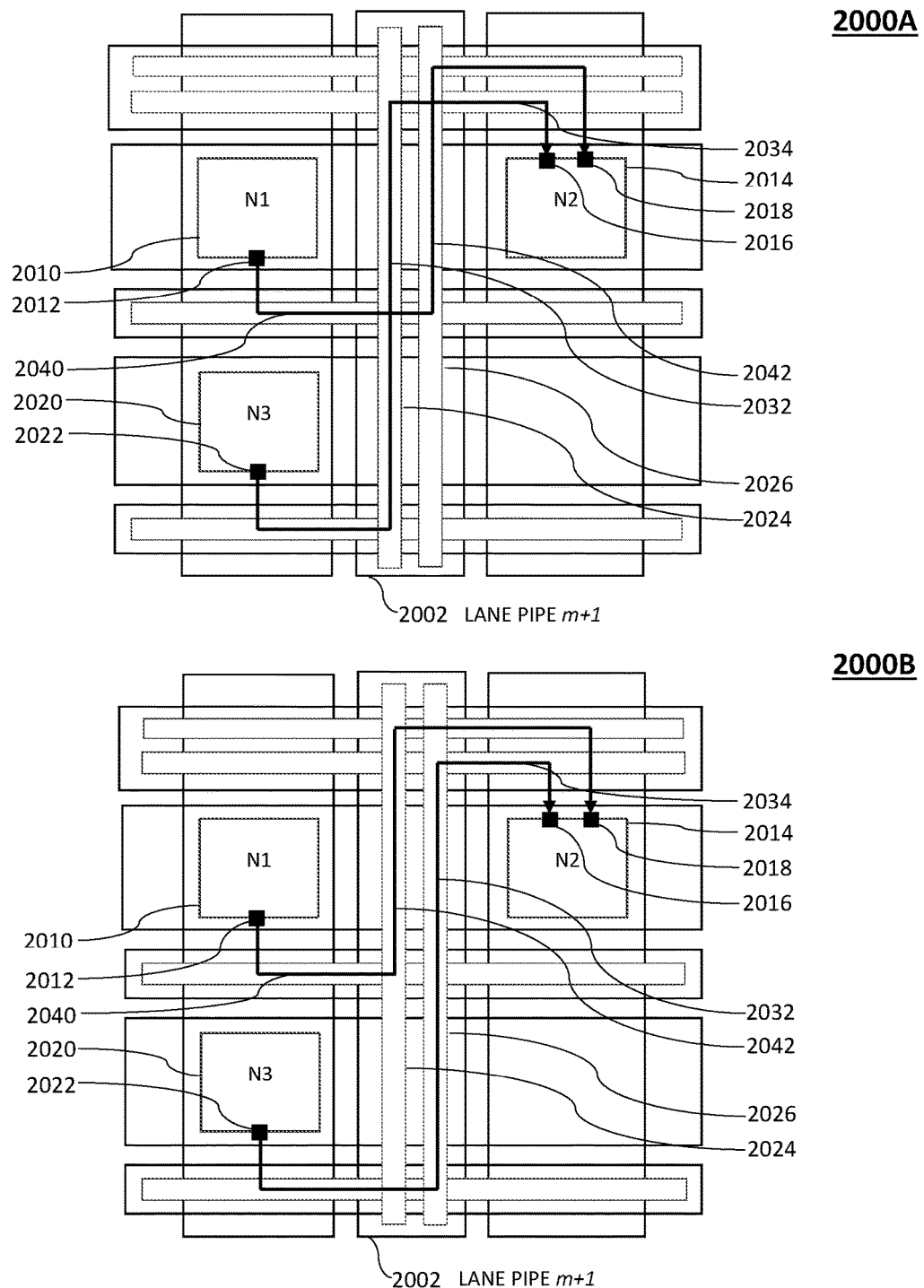
FIG. 20 illustrates an example of intersections between segments in a pipe and segments adjacent to other segments in the same pipe, in accordance with at least one embodiment.

FIG. 20 2000A-B illustrate an example of intersections between segments in a pipe and segments adjacent to other segments in the same pipe, in accordance with at least one embodiment. Graphical representation 2000A shows the results of the routing procedures. The first step was to route an edge between output port 2022 of node 2020 (N3) and input port 2016 of node 2014 (N2). Segment 2032 was positioned on segment track 2024 of lane pipe 2002 (LANE PIPE m+1). Next, an edge was routed between output port 2012 of node 2010 (N1) and input port 2018 of node 2014 (N2). Segment 2042 was positioned on second segment track 2026 of lane pipe 2002 (LANE PIPE m+1).

The analysis of the first iteration through the segments assigned to lane pipe 2002 (LANE PIPE m+1) discovers that segment 2034, adjacent to segment 2032, intersects with segment 2042, and segment 2040, adjacent to segment 2042, intersects with segment 2032. The immediate actions to eliminate these intersections are: (a) remove segment 2032 from segment track 2024, (b) remove segment 2042 from segment track 2026, (c) position segment 2032 on segment track 2026, (d) position segment 2042 on segment track 2024, and (e) recalculate the locations of all segments. Positioning segment 2032 on segment track 2026 is possible since there are no overlapping conflicts of segment 2032 with other segments in segment track 2026 (actually there are no other segments in segment track 2026). Also, positioning segment 2042 on segment track 2024 is possible since there are no overlapping conflicts of segment 2042 with other segments in segment track 2024 (actually there are no other segments in segment track 2024). The next iteration through the segments assigned to lane pipe 2002 (LANE PIPE m+1) won't find any more intersections in this pipe.

Figure 21:
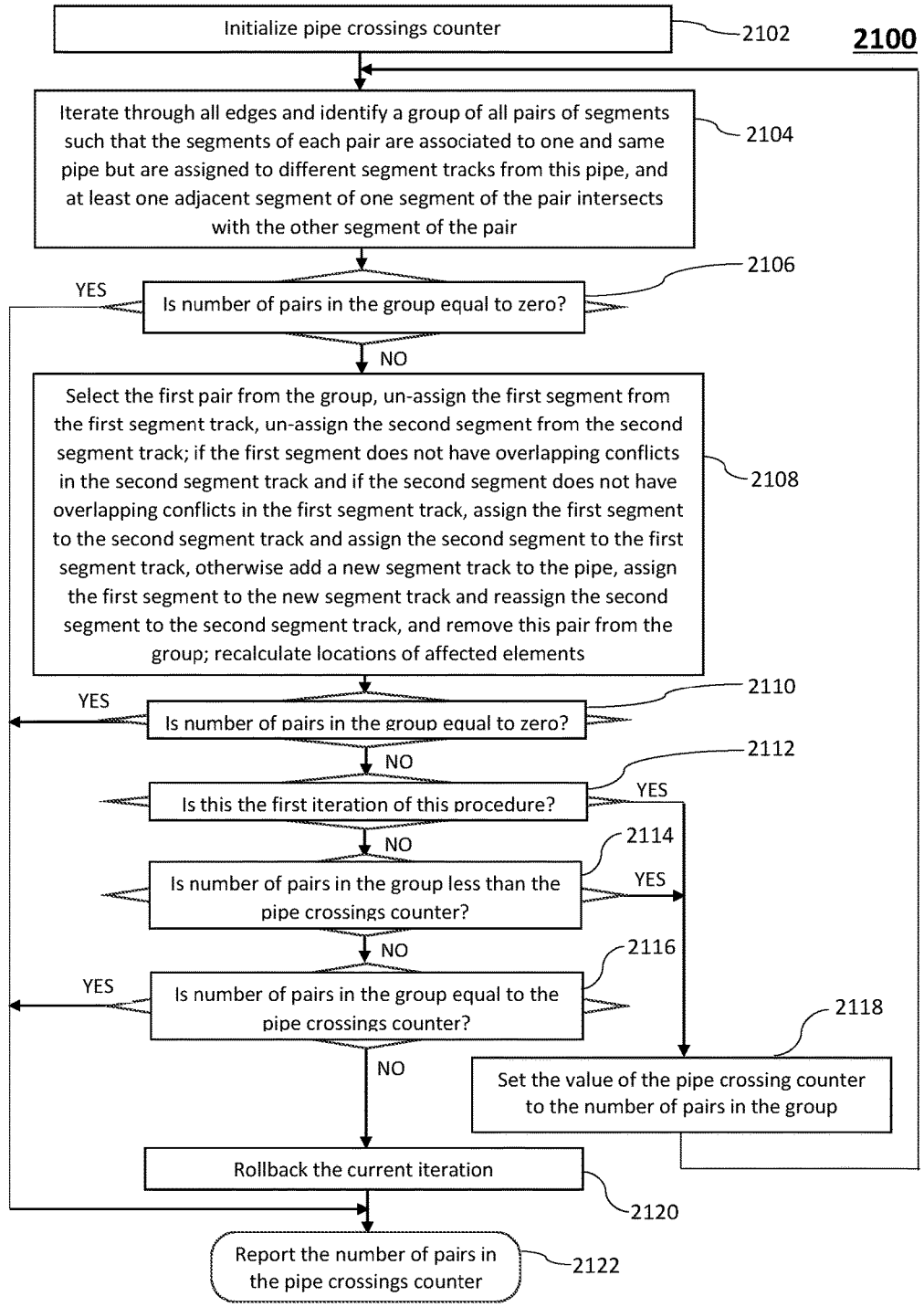
FIG. 21 is a flowchart that illustrates an example procedure for the detection and fixing of intersections between segments in pipes and segments adjacent to other segments in same pipes, in accordance with at least one embodiment.

The flowchart in FIG. 21 illustrates an example procedure 2100 for the detection and fixing of the intersections between segments in pipes and segments adjacent to other segments in the same pipes, in accordance with at least one embodiment. This procedure is discussed in relation to FIG. 20. The first step 2102 is to initialize a pipe crossings counter to calculate the intersections. The next step 2104 is the iteration through the set of edges to identify a pipe crossings group consisting of zero or more ordered pairs of segments so that the segments of a pair selected from the pipe crossings group are assigned to one and the same pipe but are positioned on different segment tracks from said pipe, and at least one segment adjacent to a segment selected from the pair intersects with another segment selected from the pair. The next step 2106 is to check the number of pairs in the pipe crossings group. If the number of pairs is equal to zero, the procedure ends by reporting 2122 of zero value. If the number of pairs is greater than zero, the next step 2108 is to select the first pair from the pipe crossings group, to remove the first segment from the first segment track, to remove the second segment from the second segment track; and if the first segment does not have overlapping conflict with any of the remaining segments positioned on the second segment track and if the second segment does not have overlapping conflict with any of the remaining segments positioned on the first segment track, to position the first segment on the second segment track and to position the second segment on the first segment track, otherwise to add an additional segment track to the pipe that the segments from the first pair are assigned to, to position the first segment on the additional segment track, to reposition the second segment on the second segment track, to remove the first pair from the pipe crossings group and to recalculate the locations of all affected graphical elements. The next step 2110 is to check the current number of pairs in the pipe crossings group. If the current number of pairs is equal to zero, the procedure ends by reporting 2122 of zero value. If the current number of pairs is greater than zero, the next step 2112 is to check if this is the first iteration of this procedure. If the result is negative (not the first iteration), the next step 2114 is to check if the number of pairs in the pipe crossings group is less than the value in the pipe crossings counter. If the result from step 2114 is negative, the next step 2116 is to check if the number of pairs in the pipe crossings group is equal to the value in the pipe crossings counter. If the result from step 2116 is positive, this means that the minimal number of intersections between segments in pipes and segments adjacent to other segments in the same pipes is reached, the iterations are ended by reporting 2122 of the number of pairs in the pipe crossings counter. This number is the actual number of unresolved intersections. If the result from step 2116 is negative, this means that the number of pairs in the pipe crossings group is greater than the value in the pipe crossings counter and the minimal number of intersections was detected in the previous iteration. The next step 2120 is to roll back the current iteration to the previous one, and to end the iterations by reporting 2122 of the number of pairs in the pipe crossings counter. If the result from step 2112 is positive (this is the first iteration of the procedure), or if the result from step 2114 is positive (the number of pairs in the pipe crossings group is less than the value in the pipe crossings counter), the next step 2118 is to set the value of the pipe crossings counter to be equal to the number of pairs in the pipe crossings group, and to return to step 2104 for the next iteration.

Figure 22:
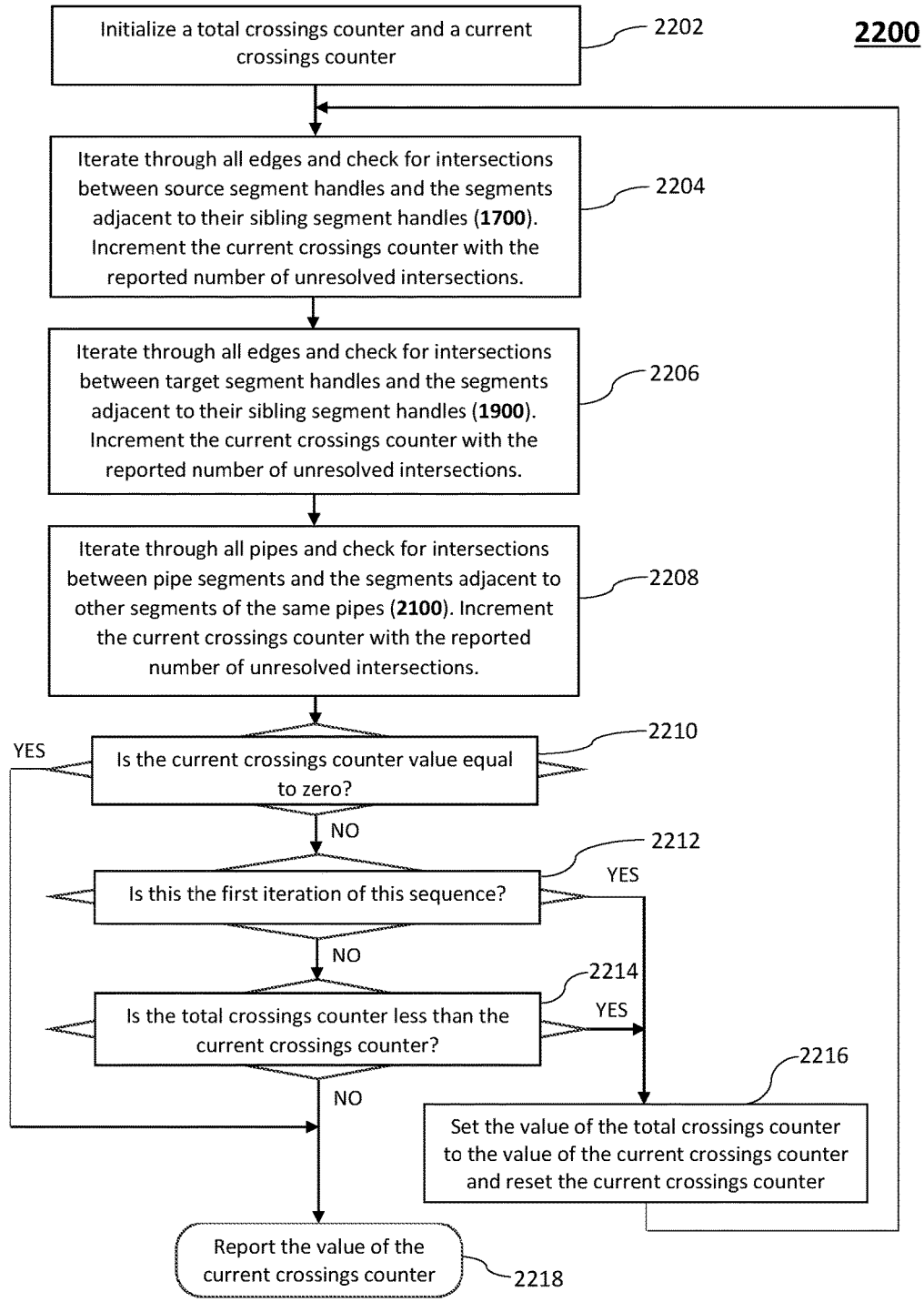
FIG. 22 is a flowchart that illustrates an example sequence of procedures for crossings reduction, in accordance with at least one embodiment.

The flowchart in FIG. 22 illustrates an implementation of crossings reduction component 116 with an example iterative sequence of procedures for crossings reduction 2200, in accordance with at least one embodiment. The first step 2202 initializes a total crossings counter to monitor the number of unresolved edge crossings after each iteration, as well as a current crossings counter to accumulate the number of unresolved edge crossings at each step. The next step 2204 is to activate procedure 1700 illustrated in FIG. 17. As demonstrated above, procedure 1700 iterates through all edges to detect and fix intersections between source segment handles and segments adjacent to their sibling source segment handles. At its completion, procedure 1700 reports the number of unresolved intersections and this number is used to increment the value of the current crossings counter. The next step 2206 is to activate procedure 1900 illustrated in FIG. 19. As demonstrated above, procedure 1900 iterates through all edges to detect and fix intersections between target segment handles and segments adjacent to their sibling target segment handles. At its completion, procedure 1900 reports the number of unresolved intersections and this number is used to increment the value of the current crossings counter. The next step 2208 is to activate procedure 2100 illustrated in FIG. 21. As demonstrated above, procedure 2100 iterates through all pipes to detect and fix intersections between segments in pipes and segments adjacent to other segments in the same pipes. At its completion, procedure 2100 reports the number of unresolved intersections and this number is used to increment the value of the current crossings counter. The next step 2210 is to check the value of the current crossings counter. If this value is equal to zero, the sequence ends 2218 by reporting the zero value. If this value is not equal to zero, the next step 2212 is to check if this is the first iteration of this sequence. If the result is negative (not the first iteration), the next step 2214 is to check if the value of the total crossings counter is less than the value of the current crossings counter. If this value is negative, meaning that the minimal total number of unresolved intersections has been reached, the iterations of the sequence end with the reporting 2218 of the number of unresolved intersections. If the result from step 2212 is positive (this is the first iteration of the sequence), or if the result from step 2214 is positive (the value of the total crossings counter is less than the value of the current crossings counter), the next step 2216 is to set the value of the total crossings counter to the value of the current crossings counter, to reset the current crossings counter, and to return to step 2204 for the next iteration of the sequence.

The order in which the procedures for crossings reduction are described here should not be seen as a limitation, that is, any number of the described procedures can be combined in any order so as to implement crossings reduction component 116. In some embodiments, crossings reduction results may be monitored by counting the number of unresolved cases after each iteration. Multiple iterations will reduce this number until the number of unresolved cases is reported to be not less that the number reported in the previous iteration.

Figure 23:
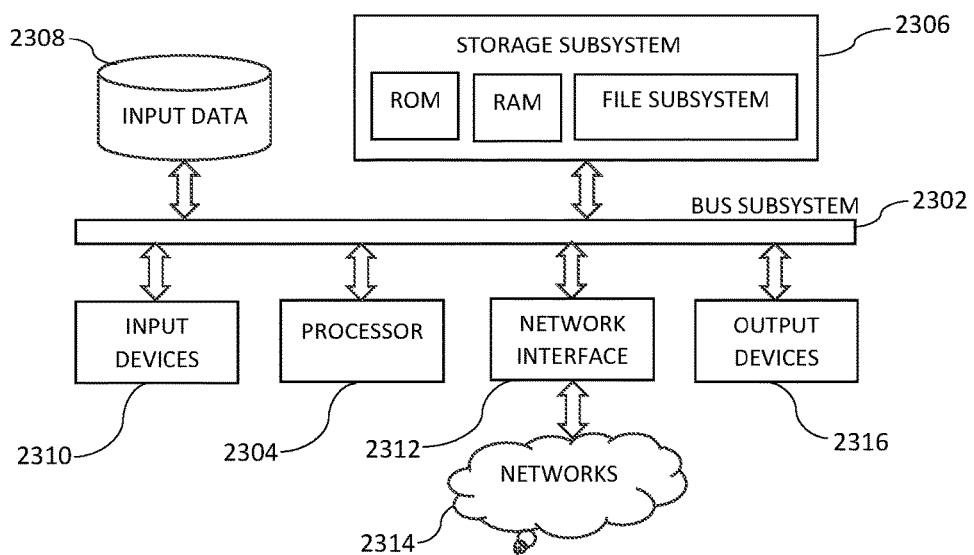
FIG. 23 illustrates an example of a simplified block diagram of a computer system environment, in accordance with at least one embodiment.

FIG. 23 2300 is an example of a simplified block diagram of a computer system environment that may be used to practice an embodiment of the presented method. As shown in graphical representation 2300, the computer system includes a processor 2304 that communicates with a number of peripheral subsystems via a bus subsystem 2302. These peripheral subsystems may include a storage subsystem 2306, comprising a ROM, RAM and file subsystem, data store for input data 2308, input devices 2310, output devices 2316, and a network interface subsystem 2312 to connect to networks 2314.

The bus subsystem 2302 provides a mechanism for the various components and subsystems of the computer system shown in graphical representation 2300 to communicate with each other. Data store 2308 contains the input graph description data. Network interface subsystem 2312 provides a communication interface to other computer systems, networks and portals 2314. Input devices 2310 may include a keyboard, pointing devices such as a mouse, trackball, touchpad, or graphics tablet, and other types of input devices for receiving various inputs from users. Output devices 2316 may include computer screens or other computer-driven graphical output devices that can be used to present in visual form drawings of the routed graph diagram. Storage subsystem 2306 provides a computer-readable medium for storing the basic programming and data constructs necessary to provide the functionality of the presented method. The software modules may be executed by processor(s) 2304. Storage subsystem 2306 may also provide a repository for storing interim data or/and to persist the final results of the routing procedures.

The computer system illustrated in 2300 can be of various types, including a personal computer, a portable computer, a workstation, a network computer, a mainframe, a mobile device, a tablet device, and a server or any other data processing system. The description of computer system 2300 is presented only as a specific example to illustrate an embodiment of the computer system. Many other configurations are possible, having more or fewer components than the system illustrated in 2300.

The described techniques make the presented method suitable for implementation in various software and/or combined software and hardware applications, especially in interactive diagramming tools for generating and editing a wide variety of graph diagrams.

Although specific embodiments of the disclosure have been described, various modifications, alterations, alternative constructions, and equivalents are also acceptable within the scope of the disclosure. Embodiments of the present disclosure may be implemented only in hardware, or only in software, or using combinations thereof. Additionally, although embodiments of the present disclosure have been described using a particular series of steps, it should be apparent to those skilled in the art that the scope of the present disclosure is not limited to the described order of steps.

The descriptions and drawings are therefore to be regarded in an illustrative rather than a restrictive sense. It should be evident that additions, subtractions, deletions, and other modifications and changes could be made. Although embodiments have been described in a language specific to certain structural features and/or methodological acts, it is to be understood that the disclosure is not necessarily limited to the specific features or acts described. Rather, the specific features and acts are disclosed as illustrative examples for the implementation of the embodiments. Conditional language, such as, among others, "can," or "may," unless specifically stated otherwise, or otherwise understood within the context as used, is generally intended to indicate that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A computer-implemented method for orthogonal edge routing of a directed layered graph using a computer system configured with executable instructions, comprising:

a) receiving input data that includes a plurality of nodes with predetermined positions on a grid and a plurality of edge connections, wherein said graph has a flow direction selected from the group consisting of horizontal flow direction and vertical flow direction, wherein the nodes, in accordance with their predetermined positions, are located in grid cells at the intersections between layers ordered across the flow direction and lanes ordered along the flow direction, wherein the position of each cell is identified by its layer number and its lane number, wherein each edge connection defines a start point and an end point of an edge, wherein each edge connects two nodes;

b) determining a plurality of layer pipes defined as rectangular regions between and around said layers oriented across the flow direction, and determining a plurality of lane pipes defined as rectangular regions between and around said lanes oriented along the flow direction, said layer pipes and said lane pipes jointly referred to as pipes, wherein each edge comprises a polygonal chain of segments, wherein routing the edges comprises assigning segments to said pipes;

c) selecting a median line of each rectangular shape representing a pipe, said median line running lengthwise said pipe, to be referred to as main median line of said pipe;

d) determining within each pipe zero or more segment tracks, wherein each segment track is defined as a line parallel to the orientation of said pipe and running lengthwise within said pipe, wherein multiple segment tracks within a pipe are positioned at a predetermined distance from each other, wherein multiple segment tracks within a pipe are ordered, wherein the number of segment tracks within a pipe can be increased by adding additional segment tracks, wherein each segment track represents a path for positioning one or more segments within said pipe; and e) determining, by a computing device, for each edge connection, a shortest route between said start point and said end point through a group of one or more pipes, wherein routing an edge along said route includes: defining a polygonal chain of segments between said start point and said end point along said shortest route, assigning each segment from said polygonal chain to a pipe from said group of pipes, and positioning said segment on a segment track selected from the group consisting of all segment tracks within said pipe.

2. The computer-implemented method of claim 1, wherein each segment track has zero or more segments positioned on it, wherein said segments do not have overlapping conflicts between each other, wherein overlapping conflict between two collinear segments is considered to occur whenever the distance between said segments is less than a predetermined value.

3. The computer-implemented method of claim 2, wherein assigning a new segment to a pipe comprises:

a) identifying, by a computing device, at least one segment track selected from the group consisting of all segment tracks within said pipe, so that for each segment selected from the group consisting of all segments positioned on said segment track, said segment has no overlapping conflict with said new segment, and positioning said new segment to said segment track; and b) if no such segment track is identified, adding a new segment track to said pipe and positioning said new segment to said new segment track.

4. The computer-implemented method of claim 3, wherein determining a route for an edge comprises:

a) defining the points of attachment of the ends of said edge to the two nodes it connects as ports, wherein a node at the originating end of said edge is defined as a source node and a node at the terminating end of said edge is defined as a target node, wherein the layer of said source node is defined as a source layer and the lane of said source node is defined as a source lane, wherein the layer of said target node is defined as a target layer and the lane of said target node is defined as a target lane, wherein said edge starts at an output port on said source node and ends at an input port on said target node;

b) defining the first segment of said edge as a source segment handle and the last segment of said edge as a target segment handle, wherein said source segment handle starts at said output port of said source node and extends orthogonally to a point defined as a source anchor point, wherein said target segment handle starts at a point defined as a target anchor point and extends orthogonally to said input port of said target node, wherein said source anchor point and said target anchor point are jointly referred to as anchor points;

c) locating a pipe closest to said output port and locating said source anchor point on the main median line of said pipe;

d) locating a pipe closest to said input port and locating said target anchor point on the main median line of said pipe;

e) defining a set of pipe vertices consisting of all intersection points of the main median lines of layer pipes and the main median lines of lane pipes;

f) defining a set of weighted graph vertices consisting of said source anchor point as a source vertex, said target anchor point as a destination vertex, and said set of pipe vertices;

g) identifying a shortest orthogonal path between said source anchor point and said target anchor point, applying Dijkstra's algorithm on said set of weighted graph vertices, wherein Dijkstra's algorithm produces a resulting set of vertices defining the shortest orthogonal path between said source vertex and said destination vertex, wherein each collinear group of vertices selected from said resulting set defines a new segment, wherein assigning said new segment to said pipe, and positioning said segment on a segment track selected from the group consisting of all segment tracks within said pipe;

h) defining a polygonal chain of segments between said source anchor point and said target anchor point along said shortest orthogonal path; and i) reallocating said source anchor point from the main median line of the pipe it is located to the segment track on which a segment adjacent to the source segment handle is positioned, and reallocating said target anchor point from the main median line of the pipe it is located to the segment track on which the adjacent segment of the target segment handle is positioned.

5. The computer-implemented method of claim 4, wherein said output port on said source node is located on the front side of said source node, wherein front is determined with respect to said flow direction, further comprising:

a) identifying a group consisting of one or more consecutive empty grid cells so that they are located on said source lane starting immediately after said source layer; and b) if said group is identified, selecting an empty grid cell from said group so that it is located before said target layer and is having the highest layer number, and locating said source anchor point on the main median line of the layer pipe after the layer of said empty grid cell.

6. The computer-implemented method of claim 4, wherein said input port on said target node is located on the back side of said target node, wherein back is determined with respect to said flow direction, further comprising:

a) identifying a group consisting of one or more consecutive empty grid cells so that they are located on said target lane ending immediately before said target layer; and b) if said group is identified, selecting an empty grid cell from said group so that it is located after said source layer and is having the lowest layer number, and locating said target anchor point on the main median line of the layer pipe before the layer of said empty grid cell.

7. The computer-implemented method of claim 4, wherein said output port on said source node is located on the left side of said source node, wherein left is determined with respect to said flow direction, further comprising:

a) identifying a first group consisting of one or more consecutive empty grid cells so that they are located in said source layer starting immediately after said source lane and including said target lane;

b) identifying a second group consisting of one or more consecutive empty grid cells so that they are located in said target lane ending immediately before said target layer and including said source layer; and c) if said first group is identified and if said second group is identified, selecting an empty grid cell so that it is located both in said source layer and in said target lane, and locating said source anchor point in the center of said empty grid cell.

8. The computer-implemented method of claim 4, wherein said output port on said source node is located on the right side of said source node, wherein right is determined with respect to said flow direction, further comprising:

a) identifying a first group consisting of one or more consecutive empty grid cells so that they are located in said source layer ending immediately before said source lane and including said target lane;

b) identifying a second group consisting of one or more consecutive empty grid cells so that they are located in said target lane ending immediately before said target layer and including said source layer; and c) if said first group is identified and if said second group is identified, selecting an empty grid cell so that it is located both in said source layer and in said target lane, and locating said source anchor point in the center of said empty grid cell.

9. A computer-implemented process for reducing the crossings between edges of a directed layered graph with orthogonal edge routing using a computer system configured with memory and instructions, executable by one or more processors, comprising: receiving a directed layered graph that includes a set of nodes positioned on a grid and a set of orthogonal edges, wherein each edge connects two nodes, wherein said graph has a flow direction selected from the group consisting of horizontal flow direction and vertical flow direction, wherein said nodes are located in grid cells at the intersections between layers ordered across the flow direction and lanes ordered along the flow direction, wherein each edge is routed as a polygonal chain of segments, wherein a node at the originating end of an edge is defined as a source node and the node at the terminating end of said edge is defined as a target node, wherein the points of attachment of the ends of each edge to said source node and to said target node are defined as ports, wherein each edge starts at an output port on said source node and ends at an input port on said target node, wherein the first segment of an edge attached to an output port of the source node is defined as a source segment handle, wherein the last segment of an edge attached to an input port of the target node is defined as a target segment handle, wherein said source segment handle and said target segment handle are jointly referred to as segment handles, wherein a plurality of layer pipes is defined represented as rectangular regions between and around said layers oriented across the flow direction, wherein a plurality of lane pipes is defined represented as rectangular regions between and around said lanes oriented along the flow direction, said layer pipes and said lane pipes are jointly referred to as pipes, wherein segments are embedded in pipes and each segment is assigned to a pipe it is embedded in, wherein defining within each pipe zero or more segment tracks, wherein each segment track is defined as a line parallel to the orientation of said pipe and running lengthwise within said pipe, wherein multiple segment tracks within a pipe are positioned at a predetermined distance from each other, wherein multiple segment tracks within a pipe are ordered, wherein the number of segment tracks within a pipe can be increased by adding additional segment tracks, wherein each segment track within a pipe represents a path for positioning one or more segments assigned to said pipe, wherein each segment, assigned to a pipe, is positioned on a segment track selected from the group consisting of all segment tracks within said pipe, wherein overlapping conflict between two collinear segments positioned on one and the same segment track is considered to occur whenever the distance between said segments is less than a predetermined value.

10. The computer-implemented process of claim 9, further comprising:

a) initializing, in the computer memory, a source crossings counter to evaluate intersections between source segment handles and segments adjacent to their sibling source segment handles;

b) iterating, by a computer program stored in memory, through the set of edges and discovering intersections between source segment handles and their adjacent segments, wherein identifying a source crossings group consisting of zero or more ordered pairs of source segment handles so that the source segment handles of a pair selected from said source crossings group are attached to output ports of one and the same source node and at least one source segment handle of said pair intersects with the adjacent segment of the other source segment handle of said pair;

c) if the number of pairs in said source crossings group is equal to zero, halting and reporting zero for the current number of pairs;

d) if the number of pairs in said source crossings group is greater than zero, selecting the first pair selected from said source crossings group, swapping the source segment handles from said pair between the output ports they are attached to, and removing said pair from said source crossings group;
  e) if the current number of pairs in said source crossings group is equal to zero, halting and reporting zero for the current number of pairs; and
  f) if this is the first iteration or if the current number of pairs in said source crossings group is less than said source crossings counter, setting the value of said source crossings counter to be the current number of pairs in said source crossings group and repeating b) through f); otherwise if the current number of pairs in said source crossings group is equal to said source crossings counter, halting and reporting the current number of pairs in said source crossings counter; and otherwise, if the current number of pairs in said source crossings group is greater than said source crossings counter, rolling back the current iteration, halting and reporting the current number of pairs in said source crossings counter.

11. The computer-implemented process of claim 9, further comprising:
  a) initializing, in the computer memory, a target crossings counter to evaluate intersections between target segment handles and segments adjacent to their sibling target segment handles;
  b) iterating, by a computer program stored in memory, through the set of edges and discovering intersections between target segment handles and their adjacent segments, wherein identifying a target crossings group consisting of zero or more ordered pairs of target segment handles so that the target segment handles of a pair selected from said target crossings group are attached to input ports of one and the same target node and at least one target segment handle of said pair intersects with the adjacent segment of the other target segment handle of said pair;
  c) if the number of pairs in said target crossings group is equal to zero, halting and reporting the current number of pairs as zero;
  d) if the number of pairs in said target crossings group is greater than zero, selecting the first pair selected from said target crossings group, swapping the target segment handles from said pair between the input ports they are attached to, and removing said pair from said target crossings group;
  e) if the current number of pairs in said target crossings group is equal to zero, halting and reporting the current number of pairs as zero; and
  f) if this is the first iteration or if the current number of pairs in said target crossings group is less than said target crossings counter, setting the value of said target crossings counter to be the current number of pairs in said target crossings group and repeating b) through f); otherwise if the current number of pairs in said target crossings group is equal to said target crossings counter, halting and reporting the current number of pairs in said target crossings counter; and otherwise, if the current number of pairs in said target crossings group is greater than said target crossings counter, rolling back the current iteration, halting and reporting the current number of pairs in said target crossings counter.

12. The computer-implemented process of claim 9, further comprising:
  a) initializing, in the computer memory, a pipe crossings counter to evaluate intersections between segments in pipes and segments adjacent to other segments in same pipes;
  b) iterating, by a computer program stored in memory, through the set of edges and discovering intersections between segments in pipes and segments adjacent to other segments in same pipes, wherein identifying a pipe crossings group consisting of zero or more ordered pairs of segments so that the segments of a pair selected from said pipe crossings group are assigned to one and the same pipe but are positioned on different segment tracks from said pipe, and at least one segment adjacent to a segment selected from said pair intersects with another segment selected from said pair;
  c) if the number of pairs in said pipe crossings group is equal to zero, halting and reporting the current number of pairs as zero;
  d) if the number of pairs in said pipe crossings group is greater than zero, selecting the first pair selected from said pipe crossings group, selecting the first segment selected from said first pair and selecting the segment track that said first segment is positioned on as first segment track, removing said first segment from said first segment track, selecting the second segment selected from said first pair and selecting the segment track that said second segment is positioned on as second segment track, removing said second segment from said second segment track; and if said first segment does not have overlapping conflict with any of the remaining segments positioned on said second segment track and if said second segment does not have overlapping conflict with any of the remaining segments positioned on said first segment track, positioning said first segment on said second segment track and positioning said second segment on said first segment track, otherwise adding an additional segment track to the pipe that the segments from said first pair are assigned to, positioning said first segment on said additional segment track, and repositioning said second segment to said second segment track; and removing said pair from said pipe crossings group;
  e) if the current number of pairs in said pipe crossings group is equal to zero, halting and reporting the current number of pairs as zero; and
  f) if this is the first iteration or if the current number of pairs in said pipe crossings group is less than said pipe crossings counter, setting the value of said pipe crossings counter to be the current number of pairs in said pipe crossings group and repeating b) through f); otherwise if the current number of pairs in said pipe crossings group is equal to said pipe crossings counter, halting and reporting the current number of pairs in said pipe crossings counter; and otherwise, if the current number of pairs in said pipe crossings group is greater than said pipe crossings counter, rolling back the current iteration, halting and reporting the current number of pairs in said pipe crossings counter.

\* \* \* \* \*